United States Patent
Akiyama et al.

(10) Patent No.: US 7,125,780 B2
(45) Date of Patent: Oct. 24, 2006

(54) DIELECTRIC ISOLATION TYPE SEMICONDUCTOR DEVICE AND METHOD FOR MANUFACTURING THE SAME

(75) Inventors: Hajime Akiyama, Tokyo (JP); Shinichi Izuo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/354,961

(22) Filed: Feb. 16, 2006

(65) Prior Publication Data

US 2006/0138586 A1    Jun. 29, 2006

Related U.S. Application Data

(62) Division of application No. 10/982,875, filed on Nov. 8, 2004.

(30) Foreign Application Priority Data

Dec. 12, 2003  (JP)  ............................. 2003-415253

(51) Int. Cl.
   *H01L 21/331*   (2006.01)
(52) U.S. Cl. ...................... 438/359; 438/353
(58) Field of Classification Search ......... 438/353–364
   See application file for complete search history.

(56) References Cited

U.S. PATENT DOCUMENTS 5,485,030 A *  1/1996  Terashima ................. 257/506
6,096,582 A     8/2000  Inoue et al.
6,249,026 B1    6/2001  Matsumoto et al.
2004/0119132 A1  6/2004  Akiyama et al.

FOREIGN PATENT DOCUMENTS

| DE | 4326846 A1 | 4/1994 |
| EP | 1239522 A2 | 9/2002 |
| JP | 6-216113 | 8/1994 |
| JP | 9-45762 | 2/1997 |
| JP | 3435930 | 8/2003 |

OTHER PUBLICATIONS

Kazuo Imai, "A New Dielectric Isolation Method using Proous Silicon", Solid-State Electronics, vol. 24, 1981, pp. 159-164.
Patent Abstracts of Japan, JP 9-097832, Apr. 8, 1997.

* cited by examiner

*Primary Examiner*—Cuong Nguyen
(74) *Attorney, Agent, or Firm*—Oblon, Spivak, McClelland, Maier & Neustadt, P.C.

(57) ABSTRACT

A dielectric isolation type semiconductor device and a manufacturing method therefor achieve high dielectric resistance while preventing the dielectric strength of the semiconductor device from being limited depending on the thickness of a dielectric layer and the thickness of a first semiconductor layer. A semiconductor substrate (1) and an n⁻ type semiconductor layer (2) are bonded to each other through a buried oxide film layer (3). A first porous oxide film area (10) is formed in the semiconductor substrate in a state contacting with the buried oxide film layer. A power device is formed on the n⁻ type semiconductor layer. The first porous oxide film area is formed in an area including a location right under a first main electrode (6) and extending from the first main electrode side up to a range of more than 40% of a distance (L) between the first and second main electrodes (6, 7).

6 Claims, 14 Drawing Sheets

DIELECTRIC ISOLATION TYPE SEMICONDUCTOR DEVICE AND METHOD FOR MANUFACTURING THE SAME

BACKGROUND OF THE INVENTION

1. Field of the Invention

The present invention relates to a dielectric isolation type semiconductor device and a method for manufacturing the same, in which a pair of semiconductor substrates are bonded to each other through a buried or embedded oxide film. More particularly, the invention relates to a dielectric isolation type semiconductor device and a manufacturing method therefor, in which a porous oxide film is formed in contact with and at a location right under a buried or embedded oxide film.

2. Description of the Related Art

In the past, a variety of dielectric isolation type semiconductor devices have been proposed (for instance, see a first patent document: Japanese patent No. 2739018 (FIGS. 52 through 57)).

As shown in FIGS. 52 and 53 in the first patent document, a semiconductor substrate of a dielectric isolation type semiconductor device is provided on its upper surface and lower surface with a dielectric layer and a rear surface electrode, respectively, with an $n^-$ type semiconductor layer being arranged on an upper surface of the dielectric layer.

In addition, the dielectric layer serves to dielectrically isolate the semiconductor substrate and the $n^-$ type semiconductor layer from each other, and a first insulating film defines the $n^-$ type semiconductor layer in a predetermined range.

An $n^+$ type semiconductor area of a relatively low electric resistance value is formed on the upper surface of the $n^-$ type semiconductor layer in the predetermined range defined by the first insulating film, and a $p^+$ type semiconductor area is also formed so as to surround the $n^+$ type semiconductor area. Moreover, a cathode electrode and an anode electrode are connected with the $n^+$ type semiconductor area and the $p^+$ type semiconductor area, respectively, and the cathode electrode and the anode electrode are electrically insulated from each other by a second insulating film.

Also, as shown in FIG. 54 in the first patent document, if both the anode electrode and the rear surface electrode are set to 0V with a positive voltage applied to the cathode electrode being gradually increased there will develop a first depletion layer that extends from a pn junction between the $n^-$ type semiconductor layer and the $p^+$ type semiconductor area. At this time, since the voltage of the semiconductor substrate is fixed to ground potential and acts as a field plate through the dielectric layer, a second depletion layer in addition to the first depletion layer develops so as to extend from an interface between the $n^-$ type semiconductor layer and the dielectric layer in a direction toward the upper surface of the $n^-$ type semiconductor layer.

In this manner, the first depletion layer become able to easily extend toward the cathode electrode owing to the extension of the second depletion layer, whereby an electric field at the pn junction between the $n^-$ type semiconductor layer and the $p^+$ type semiconductor area is alleviated. This effect is generally known as a RESURF (Reduced SURface Field) effect.

Further, as shown in FIG. 55 in the first patent document, let us assume that in the distribution of electric field strength in a cross section at a location sufficiently apart from the $p^+$ type semiconductor area, the vertical width of the second depletion layer is represented by x; the thickness of the dielectric layer is represented by $t_0$; and the upper surface of the $n^-$ type semiconductor layer is made to correspond to the origin of the axis of abscissa. In this case, a full voltage drop V in the above cross section is represented by the following expression (3).

$$V = q \cdot N / (\epsilon_2 \cdot \epsilon_0) \times (x^2/2 + \epsilon_2 \cdot t_0 \cdot x / \epsilon_3) \tag{3}$$

Here, note that in expression (3) above, N is an impurity concentration $[cm^{-3}]$ of the $n^+$ type semiconductor layer; $\epsilon_0$ is a dielectric constant $[C \cdot V^{-1} \cdot cm^{-1}]$; $\epsilon_2$ is the dielectric constant of the $n^-$ type semiconductor layer; and $\epsilon_3$ is the dielectric constant of the dielectric layer.

From expression (3) above, it is found that when the thickness $t_0$ of the dielectric layer is increased while keeping the amount of full voltage drop V unchanged, the vertical width x of the second depletion layer is decreased. This means the RESURF effect becomes weaker.

On the other hand, under the condition that avalanche breakdown due to the concentration of electric field at the pn junction between the $n^-$ type semiconductor layer and the $p^+$ type semiconductor area and the concentration of electric field at the interface between the $n^-$ type semiconductor layer and the $n^+$ type semiconductor area does not occur, the dielectric strength of the semiconductor device is eventually determined by avalanche breakdown due to the concentration of the electric field at the interface between the $n^-$ type semiconductor layer and the dielectric layer at a location right under the $n^+$ type semiconductor area.

In order to construct the semiconductor device so as to satisfy such a condition, the distance between the $p^+$ type semiconductor area and the $n^+$ type semiconductor area has only to be set very long so that the thickness d and the impurity concentration of the $n^-$ type semiconductor layer can be optimized.

For the above condition, it is generally known that when depletion takes place from the interface between the $n^-$ type semiconductor layer and the dielectric layer to a front surface of the $n^-$ type semiconductor layer, the concentration of the electric field at the interface between the $n^-$ type semiconductor layer and the dielectric layer just satisfies the avalanche breakdown condition, as shown in FIG. 56 in the first patent document. In this case, the depletion layer reaches the $n^+$ type semiconductor area, and depletes the entire $n^-$ type semiconductor layer.

A dielectric strength V under such a condition is represented by the following expression (4).

$$V = Ecr \cdot (d/2 + \epsilon_2 \cdot t_0 / \epsilon_3) \tag{4}$$

Here, note that in expression (4) above, Ecr is a critical electric field strength that causes avalanche breakdown, and the thickness of the $n^+$ type semiconductor area is ignored.

As shown in FIG. 57 in the above-mentioned first patent document, an electric field strength at a boundary between the $n^-$ type semiconductor layer and the dielectric layer (i.e., a position at a distance d from the origin to the electrode side) in the vertical distribution of electric field strength in a cross section right under the $n^+$ type semiconductor area reaches the critical electric field strength Ecr.

In case where the dielectric strength V of the semiconductor device is calculated with the $n^-$ type semiconductor layer being formed of silicon, and the dielectric layer being formed of a silicon oxide film, $d = 4 \times 10^{-4}$ and $t_0 = 2 \times 10^{-4}$ are adopted as general values for the distance d and the thickness $t_0$, respectively.

Moreover, in this case, the critical electric field strength Ecr, though influenced by the thickness d of the $n^-$ type semiconductor layer, is represented by about $Ecr = 4 \times 10^5$.

When this critical electric field strength Ecr $(=4\times10^5)$, $\epsilon_2(=11.7)$ and $\epsilon_3(=3.9)$ are substituted in the above expression (4), the dielectric strength V is represented by the following expression (5).

$$V=320\ V \tag{5}$$

Accordingly, when the thickness d of the n⁻ type semiconductor layer increases by 1 µm, a voltage rise or increase ΔV represented by the following expression (6) is obtained.

$$\Delta V=Ecr\times 0.5\times 10^{-4}=20[V] \tag{6}$$

In addition, when the thickness $t_0$ of the dielectric layer increases by 1 µm, the voltage rise or increase ΔV represented by the following expression (7) is obtained.

$$\Delta V=Ecr\times 11.7\times 10^{-4}/3.9=120\ [V] \tag{7}$$

As will be clear from the results of the calculations of the above expressions (6), (7), a rise or increase in the dielectric strength is greater when the dielectric layer is set thick than when the n⁻ type semiconductor layer is set thick, and hence it can be seen that in order to raise or increase the dielectric strength, it is effective to set the dielectric layer thick.

In addition to this, setting the n⁻ type semiconductor layer thick makes it necessary to employ a technique of etching deeper trenches so as to form the first insulating film, which requires development of a new technology and hence is not desirable.

On the other hand, when the thickness $t_0$ of the dielectric layer is increased, the extension x of the second depletion layer becomes small, as stated above, thus resulting in reduction in the RESURF effect. That is, the concentration of the electric field at the pn junction between the p⁺ type semiconductor area and the n⁻ type semiconductor layer increases, whereby the dielectric strength will be limited by the accordingly increased probability of avalanche breakdown at this pn junction.

Thus, as stated above, the known dielectric isolation type semiconductor device has a problem in that the dielectric strength of the semiconductor device is limited depending upon the thickness $t_0$ of the dielectric layer and the thickness d of the n⁻ type semiconductor layer.

SUMMARY OF THE INVENTION

The present invention is intended to solve the problem as referred to above, and has for its object to obtain a dielectric isolation type semiconductor device and a manufacturing method therefor in which high dielectric resistance can be achieved while preventing the dielectric strength of the semiconductor device from being limited depending upon the thickness of a dielectric layer and the thickness of a first semiconductor layer.

A dielectric isolation type semiconductor device according to the present invention includes a semiconductor substrate having a principal plane and a rear surface disposed on opposite sides thereof, and a main dielectric layer disposed adjacent to an entire area of the principal plane of the semiconductor substrate. A first semiconductor layer of a first conductive type of a low impurity concentration having a front surface is bonded to the semiconductor substrate through the main dielectric layer. A second semiconductor layer of a first conductive type of a high impurity concentration having a front surface is selectively formed on the front surface of the first semiconductor layer. A third semiconductor layer of a second conduction type of a high impurity concentration is formed on the first semiconductor layer at a location apart from the second semiconductor layer so as to surround the second semiconductor layer. A ring-shaped insulating layer is formed on the first semiconductor layer in a manner to surround an outer peripheral edge of the third semiconductor layer and to extend from the front surface of the first semiconductor layer up to the main dielectric layer. A first main electrode is disposed on and joined to the front surface of the second semiconductor layer. A second main electrode is disposed on and joined to the front surface of the third semiconductor layer. A rear surface electrode is formed on the rear surface of the semiconductor substrate. A first supplementary dielectric layer is formed in the semiconductor substrate in a state contacting with the principal plane side of the main dielectric layer. The first supplementary dielectric layer is formed of a porous oxide film, and provided in an area including a location right under the first main electrode and extending from the first main electrode side up to a range of more than 40% of a distance between the first and second main electrodes.

According to the present invention, the thickness of the main dielectric layer can be made thin so as not to impair a RESURF effect, and at the same time, the total thickness of the dielectric layer can be increased in a range where the first supplementary dielectric layer is formed, so that a voltage drop is increased, thereby making it possible to improve the dielectric strength of the device. In addition, since the first supplementary dielectric layer is formed of a porous oxide film having a large oxide film forming rate, the manufacturing time and cost can be reduced to a remarkable extent.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described in detail while referring to the accompanying drawings.

Embodiment 1.

Figure 1:
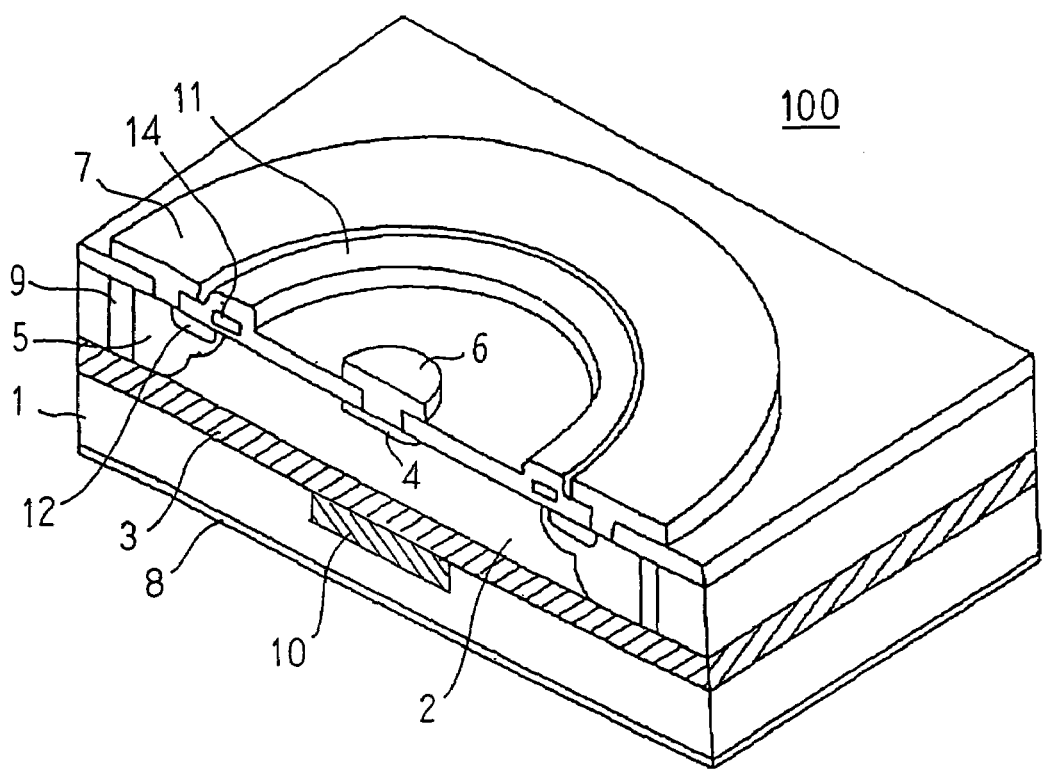
FIG. 1 is a cross sectional perspective view showing a dielectric isolation type semiconductor device according to a first embodiment of the present invention.
Figure 2:
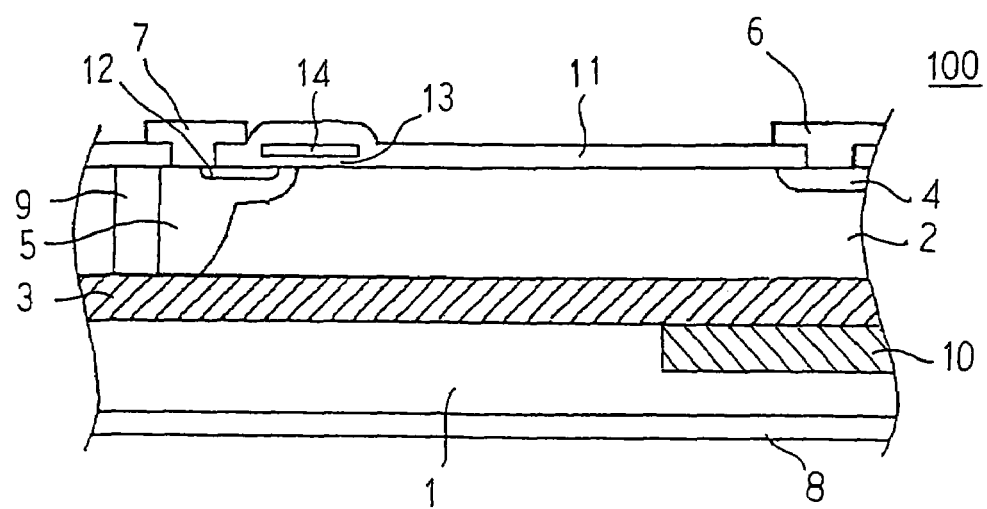
FIG. 2 is a cross sectional view of essential portions showing the dielectric isolation type semiconductor device according to the first embodiment of the present invention.

FIG. 1 is a cross sectional perspective view that illustrates a dielectric isolation type semiconductor device according to a first embodiment of the present invention, and FIG. 2 is a cross sectional view of essential portions that illustrates the dielectric isolation type semiconductor device according to the first embodiment of the present invention.

In FIGS. 1 and 2, a buried or embedded oxide film layer 3 (main dielectric layer) and a rear surface electrode 8 are provided on an upper surface and a lower surface, respectively, of a semiconductor substrate 1, with an $n^-$ type semiconductor layer 2 (first semiconductor layer of a first conductive type having a low impurity concentration) being arranged on an upper surface of the buried oxide film layer 3. This buried oxide film layer 3 functions as a dielectric layer that serves to dielectrically separate or isolate the semiconductor substrate 1 and the $n^-$ type semiconductor layer 2 from each other. In addition, an insulating layer 9 (trench isolation) is formed in the shape of a ring so as to penetrate through the $n^-$ type semiconductor layer 2 to extend from a front surface of the $n^-$ type semiconductor layer 2 to the buried oxide film layer 3, thereby defining the $n^-$ type semiconductor layer 2 into a prescribed range (ring shape).

The $n^+$ type semiconductor area 4 (second semiconductor layer of a first conductive type having a high impurity concentration), being lower in electric resistance than the $n^-$ type semiconductor layer 2, is formed on the $n^-$ type semiconductor layer 2 in the prescribed range defined by the insulating layer 9, and the $p^+$ type semiconductor area 5 (third semiconductor layer of the second conduction type having a high impurity concentration) is selectively formed in the $n^-$ type semiconductor layer 2 in such a manner as to surround the $n^+$ type semiconductor area 4. A first main electrode 6 and a second main electrode 7 are connected with the $n^+$ type semiconductor area 4 and the $p^+$ type semiconductor area 5, respectively, and they are electrically insulated from each other by an insulating film 11.

The first porous oxide film area 10 (first supplementary dielectric layer) is formed in the semiconductor substrate 1 in such a manner as to contact a lower surface of the buried oxide film layer 3 at a location right under the first main electrode 6. Also, an $n^+$ type semiconductor area 12 is selectively formed on an upper surface of the $p^+$ type semiconductor area 5 so that it is connected with the $p^+$ type semiconductor area 5 and the second main electrode 7. In addition, a gate electrode 14 is formed in the vicinity of the second main electrode 7 and at a location nearer to the first main electrode 6 so as to be included in the insulating film 11. The insulating film 11 is formed of an oxide film for instance, and an area of the insulating film 11 lying right under the gate electrode 14 functions as a gate oxide film 13.

A dielectric isolation type semiconductor device 100 as constructed in this manner is of a structure in which the gate electrode 14 is arranged in opposition to the p+ type semiconductor area 5, the n+ type semiconductor area 12 and the n− type semiconductor layer 2 through the gate oxide film 13. Thus, The dielectric isolation type semiconductor device 100 serves as a power device in the form of an n-channel MOS transistor with the second main electrode 7 acting as a source electrode, and the first main electrode 6 acting as a drain electrode.

Figure 3:
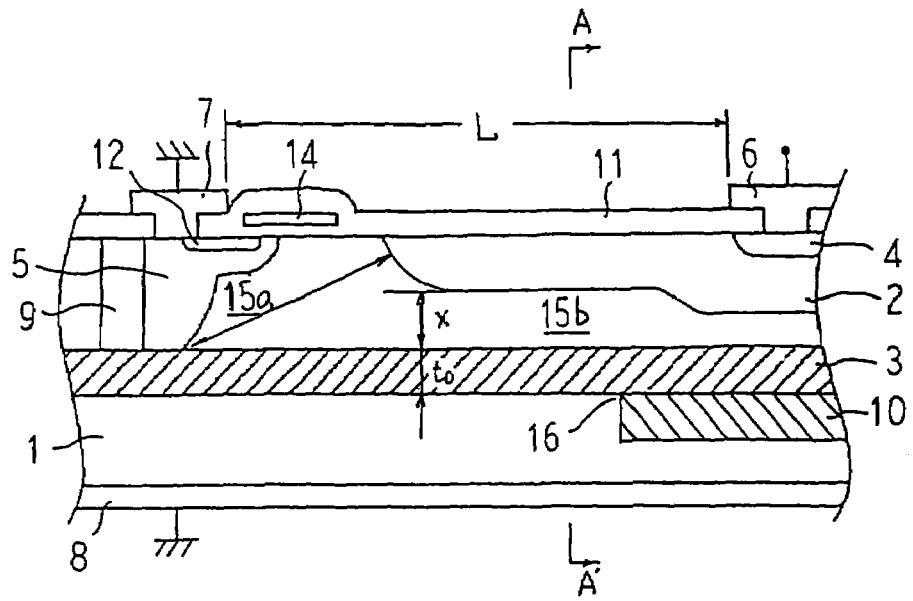
FIG. 3 is a cross sectional view explaining the holding operation of the normal or forward dielectric strength of the dielectric isolation type semiconductor device according to the first embodiment of the present invention.
Figure 4:
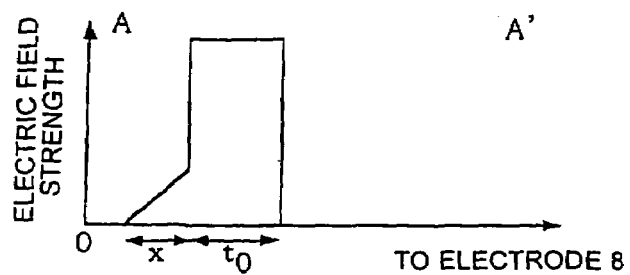
FIG. 4 is an explanatory view showing the distribution of electric field strength in a cross section along line A–A' in FIG. 3.

FIG. 3 is a cross sectional view that explains the holding operation of the normal or forward dielectric strength of the dielectric isolation type semiconductor device 100 according to the first embodiment of the present invention, and FIG. 4 is an explanatory view that illustrates the distribution of electric field strength in a cross section along line A–A' of FIG. 3.

In FIG. 3, there are shown the thickness $t_0$ of the buried oxide film layer 3, an edge 16 of the first porous oxide film area 10, depletion layers 15a, 15b associated with the n− type semiconductor layer 2, the thickness x of the depletion layer 15b, and a distance L between the first main electrode 6 and the second main electrode 7.

In FIG. 3, when a positive voltage (+V) provided to the first main electrode 6 is gradually increased with both the second main electrode 7 and the rear surface electrode 8 being set to ground potential (0V), the depletion layer 15a develops to extend from a pn junction between the n− type semiconductor layer 2 and the p+ type semiconductor area 5.

At this time, the semiconductor substrate 1 acts as a field plate with its voltage fixed to ground potential through the dielectric layers (the buried oxide film layer 3 and the first porous oxide film area 10), so the depletion layer 15b in addition to the depletion layer 15a also develops to extend in a direction from an interface between the n− type semiconductor layer 2 and the dielectric layers toward an upper surface of the n− type semiconductor layer 2.

Accordingly, an electric field at the pn junction between the n− type semiconductor layer 2 and the p+ type semiconductor area 5 is alleviated by a RESURF effect.

FIG. 4 shows the distribution of electric field strength at a location (i.e., in a cross section along line A–A' in FIG. 3) sufficiently apart from the p+ type semiconductor area 5.

In FIG. 4, the axis of abscissa represents positions at the rear surface electrode 8 side, and the axis of ordinate represents electric field strength, and the upper surface of the n− type semiconductor layer 2 corresponds to the origin of the axis of abscissa, with the thickness (extension) of the depletion layer 15b being represented by x, and the thickness of the buried oxide film layer 3 being represented by $t_0$.

A full voltage drop V in the cross section along line A–A' is represented by the above-mentioned expression (3), as in the case of the aforementioned known dielectric isolation type semiconductor device.

In other words, even if the full voltage drop is equal or unchanged, the extension x of the depletion layer 15b becomes shorter when the thickness $t_0$ of the buried oxide film layer 3 is set to be thicker, and as a result, the RESURF effect is reduced.

On the other hand, under the condition that avalanche breakdown due to the concentration of electric field at the pn junction between the n− type semiconductor layer 2 and the p+ type semiconductor area 5 and the concentration of electric field at the interface between the n− type semiconductor layer 2 and the n+ type semiconductor area 4 does not occur, the dielectric strength of the semiconductor device 100 is eventually determined by avalanche breakdown due to the concentration of electric field at the interface between the n− type semiconductor layer 2 and the buried oxide film layer 3 at a location right under the n+ type semiconductor area 4.

In order to construct the semiconductor device 100 so as to satisfy such a condition, the distance L between the p+ type semiconductor area 5 and the n+ type semiconductor area 4 has to be set very long so that the thickness d and the impurity concentration N of the n− type semiconductor layer 2 can be optimized. For example, assuming that the dielectric strength is 600 V, the distance L can be designed to be 70 μm–100 μm or so.

Figure 5:
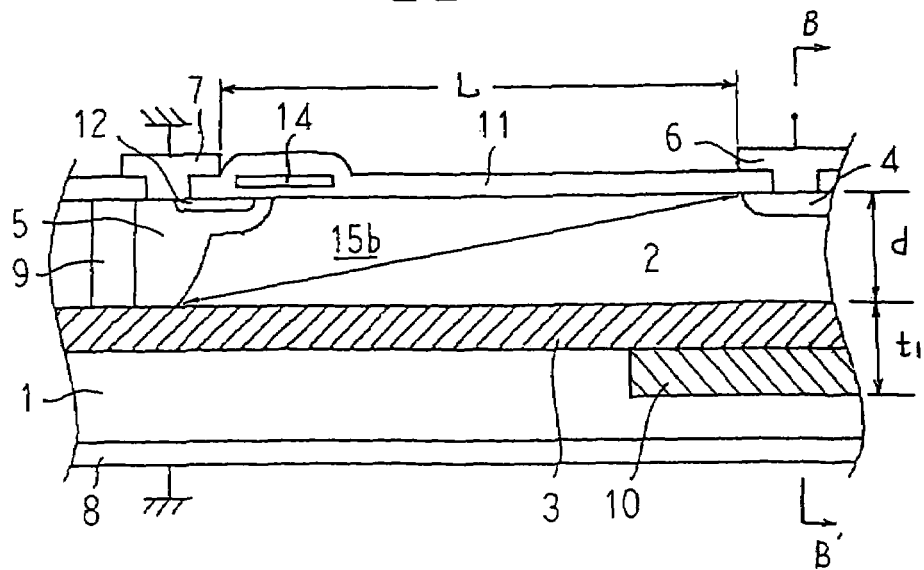
FIG. 5 is a cross sectional view explaining the holding operation of the normal or forward dielectric strength of the dielectric isolation type semiconductor device under a dielectric strength condition according to the first embodiment of the present invention.

FIG. 5 is a cross sectional view that explains the holding operation of the normal or forward dielectric strength of the dielectric isolation type semiconductor device 100 under the above-mentioned condition.

It is generally known that the above condition means that when depletion takes place from the interface between the n− type semiconductor layer 2 and the buried oxide film layer 3 to the front surface of the n− type semiconductor layer 2, the concentration of electric field at the interface between the n− type semiconductor layer 2 and the buried oxide film layer 3 just satisfies the avalanche breakdown condition.

In FIG. 5, it is illustrated that the depletion layer 15b reaches the n+ type semiconductor area 4, and the entire n− type semiconductor layer 2 is depleted.

The dielectric strength V under such a condition is represented by a full voltage drop at a location right under the n+ type semiconductor area 4 (i.e., in a cross section along line B–B' in FIG. 5), and it is represented such as by the following expression (8).

$$V = Ecr \cdot (d/2 + \epsilon_2 \cdot t_1/\epsilon_3) \tag{8}$$

Here, in expression (8) above, $t_1$ is the total thickness of the dielectric layers (i.e., the thickness of the buried oxide film layer 3 plus the first porous oxide film area 10) [cm], and the thickness of the n+ type semiconductor area 4 is ignored.

In this regard, note that the above expression (8) is equal to the above-mentioned expression (4) with the thickness to therein being replaced by the thickness $t_1$.

Figure 6:
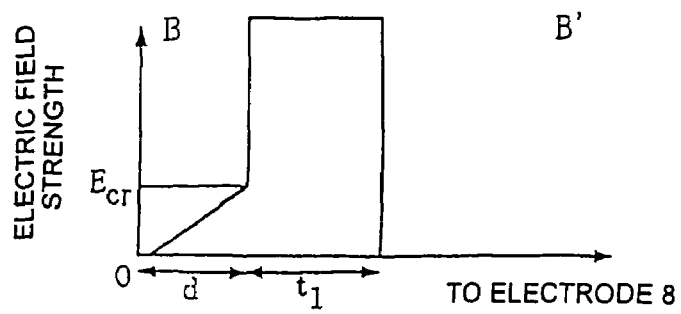
FIG. 6 is an explanatory view showing the distribution of electric field strength in a cross section along line B–B' in FIG. 5.

FIG. 6 is an explanatory view that shows the distribution of electric field strength in a cross section along line B–B' in FIG. 5.

In FIG. 6, the electric field strength at a boundary between the n− type semiconductor layer 2 and the dielectric layers (i.e., the position at a distance d from the origin to the electrode 8 side) reaches the critical electric field strength Ecr.

That is, as can be seen from the above-mentioned expressions (3), (8), a voltage drop can be increased thereby to improve the dielectric strength in comparison with the aforementioned known case by setting the thickness $t_0$ of the buried oxide film layer 3 to be relatively thin so as not to impair the RESURF effect, and by setting the total thickness $t_1$ of the dielectric layers in a range, in which the first porous oxide film area 10 is formed, to be relatively thick.

Figure 7:
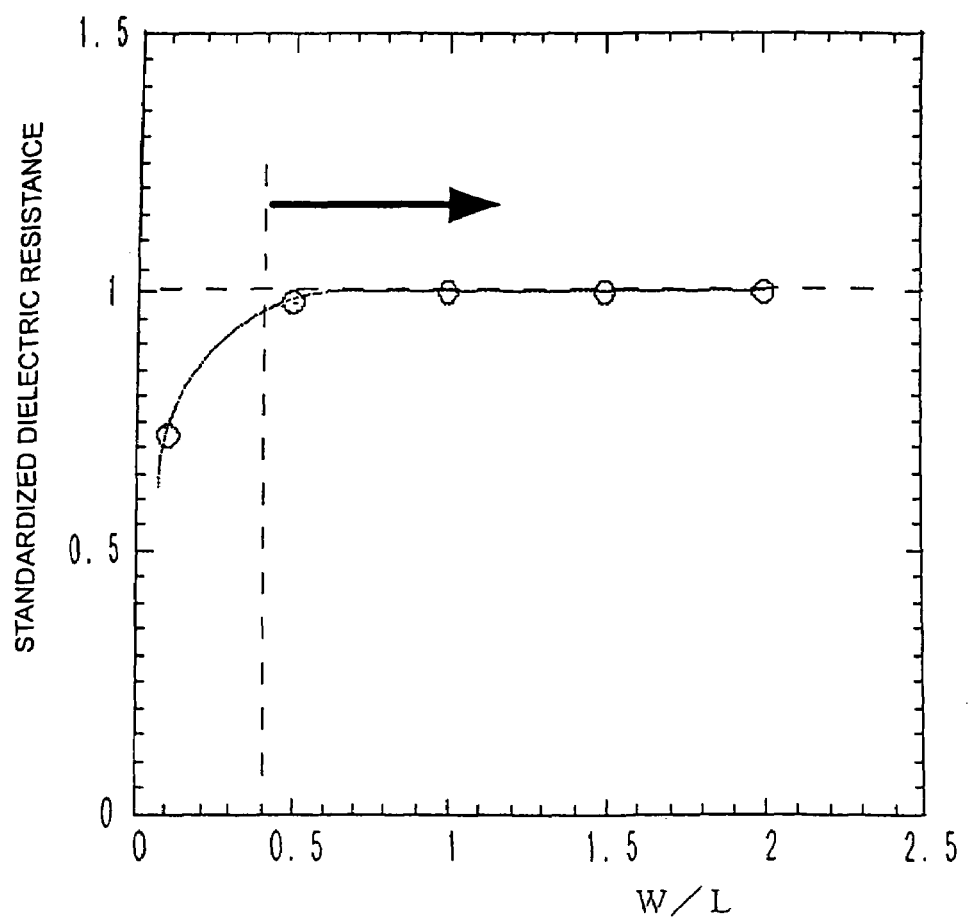
FIG. 7 is a view explaining the relation between the ratio (W/L) of the width W of a porous oxide film area to the distance L between first and second main electrodes and the dielectric strength in the dielectric isolation type semiconductor device according to the first embodiment of the present invention.

Here, reference will be made to the relation between the ratio (W/L) of the width W of the first porous oxide film area 10 to the distance L between the first and second main electrodes 6, 7 and the dielectric strength while referring to FIG. 7. In FIG. 7, the axis of ordinate represents the standardized dielectric strength or voltage, and the axis of abscissa represents the ratio W/L.

From FIG. 7, it is found that in an area where the width W of the first porous oxide film area 10 is less than 40% of the distance L between the first and second main electrodes 6, 7, the dielectric strength rapidly increases in accordance with the increasing width W of the first porous oxide film area 10, and a substantially predetermined value of dielectric strength can be obtained when the width W of the first porous oxide film area 10 exceeds the 40% of the distance L between the first and second main electrodes 6, 7.

From this, it is preferable, in view of the dielectric strength, that the edge 16 of the first porous oxide film area 10 be set at a location apart 40% or more of the distance L between the first and second main electrodes 6, 7 from the first main electrode 6 side toward the second main electrode 7.

Further, in this dielectric isolation type semiconductor device 100, the thickness $t_0$ of the buried oxide film layer 3 is properly decreased to avoid an adverse influence on the RESURF effect, and at the same time, the total thickness $t_1$ of the dielectric layers is increased in the range where the first porous oxide film area 10 is formed, whereby a voltage drop can be increased, thus making it possible to improve the dielectric strength of the device. Here, the oxidation rate of the porous silicon is changed in accordance with the porosity thereof, so it can be controlled to increase by from several tens of times to 100 times. Accordingly, upon oxidization, the porous silicon can be oxidized at a high speed several tens of times faster than an ordinary oxide film forming rate. Thus, in case where a dielectric layer portion to be increased in thickness for improvement of the dielectric strength is formed of an ordinary oxide film, a processing time from several days to one week or more is required, but in the case of a porous oxide film being used instead of the ordinary oxide film, only less than half a day is required, even including the time to form porous silicon that is a precursor of the porous oxide film, as a consequence of which the manufacturing time and cost can be reduced to a remarkable extent.

Here, note that the above-mentioned concept of "porosity" is a "rough density". In other words, a porosity is a physical value that is specified from the weight of the silicon eluted and the size of an area in which polysilicon is formed upon processing of single-crystal silicon into porous silicon, and it represents the shape characteristic or "the so-called level of dry roughness or coarseness" of the porous silicon. A porosity (P) is specified by the following expression (9) (see Appl. Phys. Lett, 42(4), pp. 386–388, by R. P. Holmstrom and J. Y. Chi).

$$P = \Delta m / (\sigma \times A \times t) \quad (9)$$

Here, note that in expression (9) above, $\Delta m$ is the weight of silicon eluted upon being made porous; $\sigma$ is the specific gravity (2.33 g/cm$^3$) of silicon; A is an area (cm$^2$) on which porous silicon is formed; and t is the thickness (cm) of the porous silicon film.

This porosity is a physical value that changes between from 0 to 1, where "0" represents single-crystal silicon itself, and "1" represents the state of a space completely etched. In other words, the porous silicon film becomes rougher or coarser as the porosity approaches 1.

Next, reference will be made to a method of manufacturing the dielectric isolation type semiconductor device 100 while referring to FIGS. 8A through 8E.

Figure 8A:
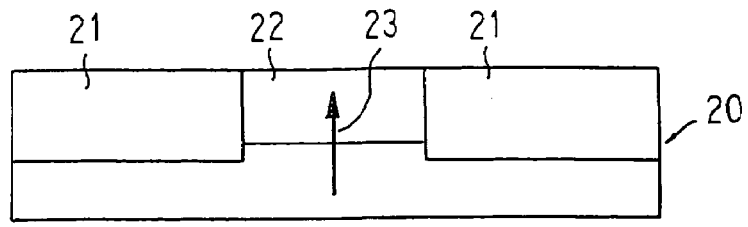
FIGS. 8A through 8E are cross sectional views explaining a method of manufacturing a dielectric isolation type semiconductor device according to the first embodiment of the present invention.
Figure 8B:
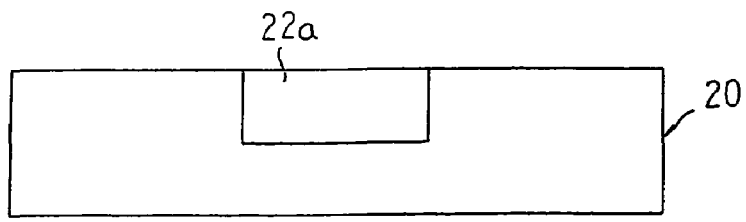

First of all, a p-type silicon substrate 20 is prepared as a semiconductor substrate. Then, an n$^+$ diffusion area 21 and a p$^+$ diffusion area 22 are formed on a principal plane of the p-type silicon substrate 20, as shown in FIG. 8A. At this time, the n$^+$ diffusion area 21 is formed so as to surround the p$^+$ diffusion area 22. Then, the p-type silicon substrate 20 is anodized in an HF solution so that an anodization current 23 flows from the rear surface of the p-type silicon substrate 20 to the p$^+$ diffusion area 22, thereby forming the p$^+$ diffusion area 22 into a porous silicon area 22a, as shown in FIG. 8B.

Figure 8C:
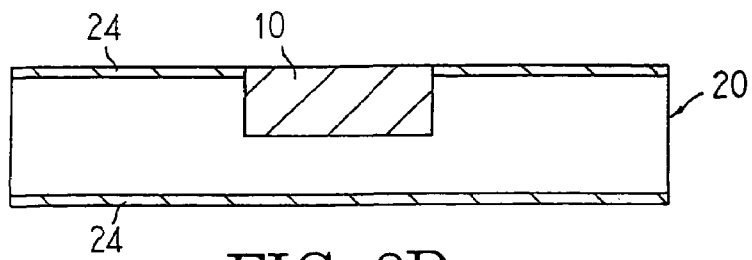

Subsequently, oxidation processing is applied to the p-type silicon substrate 20, whereby an oxide film area 24 and a first porous oxide film area 10 are formed, as shown in FIG. 8C. Here, after the porous silicon area 22a is once exposed to an oxidizing atmosphere at a low temperature of 300° C. or below, it is oxidized at a high temperature of 1,100° C. or above. As a result, condensation of the porous silicon is suppressed so the first porous oxide film area 10 not accompanying peel-off can be obtained. Here, note that a similar effect can be achieved even if the above oxidation is performed by the use of high pressure oxidation.

Figure 8D:
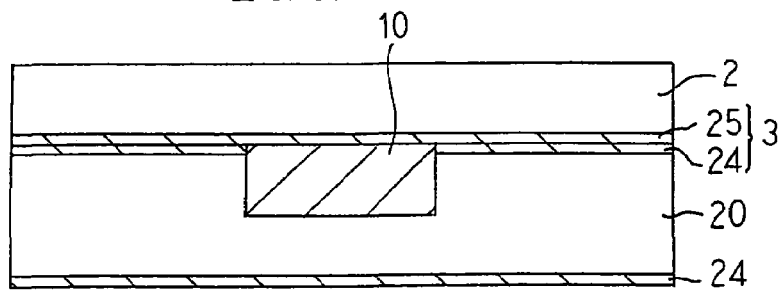

Subsequently, an n-type silicon substrate is prepared which has an oxide film layer 25 formed on its principal plane. Then, the first porous oxide film area 10 and the oxide film layer 25 are placed in intimate contact with each other, and the p-type silicon substrate 20 and the n-type silicon substrate are bonded to each other and subjected to a thermal treatment such as pyro-oxidation or the like, for example, at a temperature of 1,200° C. for 3 hours, so that the strength of bonding therebetween can be improved. Thereafter, the n-type silicon substrate is polished or ground to a predetermined thickness, thereby forming the n$^-$ type semiconductor layer 2. As a result, an SOI (Silicon On Insulator) structure as shown in FIG. 8D is obtained. Here, note that the oxide film area 24 and the oxide film layer 25 correspond to the buried oxide film layer 3.

Figure 8E:
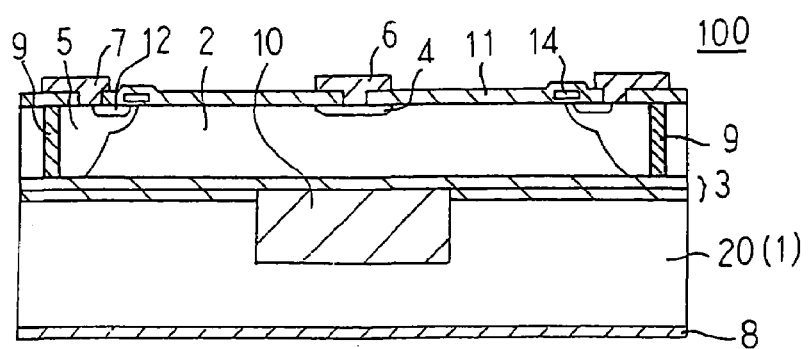

Then, a dielectric isolation type semiconductor device 100 having an n-channel HV-MOS formed thereon, as shown in FIG. 8E, is fabricated by means of an SOI process.

In this connection, it is to be noted that the manufacturing process or step of FIG. 8D can be performed, though not illustrated, by the following process, for example.

First of all, an oxide film is formed on the n$^-$ type semiconductor layer 2, and a portion of the oxide film corresponding to the insulating layer 9 is removed, so that the n$^-$ type semiconductor layer 2 is etched while being masked by the remaining oxide film, thereby to form a groove that reaches the oxide film layer 25. After the oxide film is once removed, the n$^-$ type semiconductor layer 2 is subjected to thermal oxidation so that an oxide film is thereby formed again on the surface of the n$^-$ type semiconductor layer 2. The oxide film thus formed is then etched back to fill the groove with the insulating layer 9.

Subsequently, an oxide film is formed on the n$^-$ type semiconductor layer 2, and patterning of the oxide film is carried out. Then, boron is implanted into the n$^-$ type semiconductor layer 2 while using the thus patterned oxide film as a mask, and thereafter, the n$^-$ type semiconductor layer 2 is annealed to form a p$^+$ type semiconductor area 5. In addition, similarly, an n$^+$ type semiconductor area 4 is formed by means of ion implantation and annealing. Likewise, an n$^+$ type semiconductor area 12 is also formed by means of ion implantation and annealing. Further, an insulating film 11, a gate electrode 14 and first and second main electrodes 6, 7 are provided. Finally, the entire rear surface of the semiconductor substrate 1 is polished, so that the oxide film area 24 formed on the rear surface of the semiconductor substrate 1 is thereby removed to form a rear surface electrode 8 comprising a metal deposition layer (e.g., three-layer deposition of Ti/Ni/Au, etc.). In this manner, a dielectric isolation type semiconductor device 100 is fabricated.

According to this method of manufacturing the dielectric isolation type semiconductor device 100, the p$^+$ diffusion area 22 and the n⁺ diffusion area 21 are formed on the principal plane of the p-type silicon substrate 20 prior to a step of bonding the n-type silicon substrate and the p-type silicon substrate 20 to each other, and an anodization current is passed through the p⁺ diffusion area 22 and the n⁺ diffusion area 21, so that the p⁺ diffusion area 22 is formed into the porous silicon area 22a, which is then oxidized to provide the first porous oxide film area 10. With such a method, a thick film portion of the dielectric layers bearing a large voltage drop can be produced in a short time, thus making it possible to reduce the manufacturing time and cost.

In addition, since the interior of the porous silicon area 22a is oxidized at a high temperature of 1,100° C. or above after having been once exposed to an oxidizing atmosphere at a low temperature of 300° C. or below, condensation of the porous silicon is suppressed, and hence the first porous oxide film area 10 can be produced without accompanying peel-off.

Embodiment 2.

Figure 9:
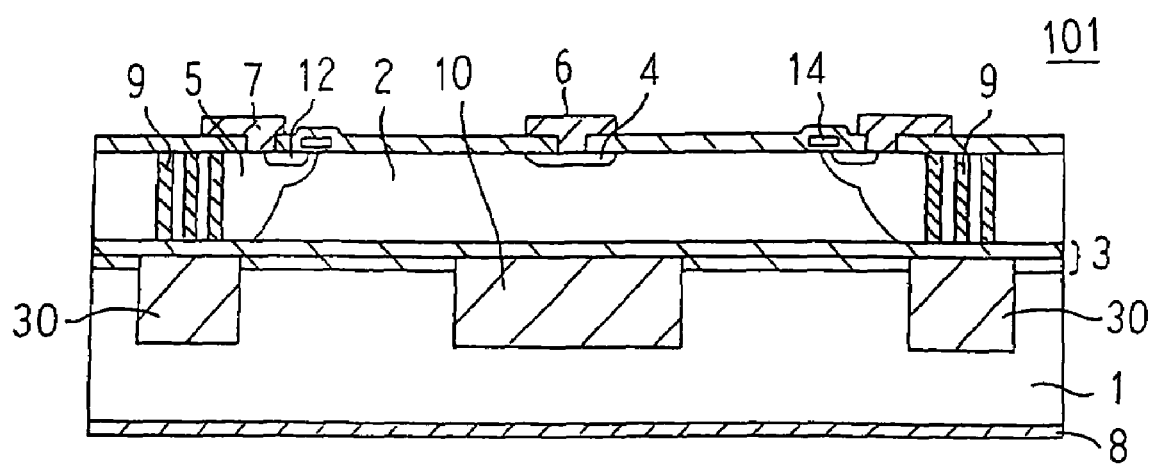
FIG. 9 is a cross sectional view showing a dielectric isolation type semiconductor device according to a second embodiment of the present invention.

FIG. 9 is a cross sectional view that illustrates a dielectric isolation type semiconductor device according to a second embodiment of the present invention.

In FIG. 9, a second porous oxide film area 30 is formed in a semiconductor substrate 1 in such a manner as to contact a lower surface of a buried oxide film layer 3 at a location right under an insulating layer 9.

Here, note that the construction of this second embodiment other than the above is similar to that of the above-mentioned first embodiment.

In a dielectric isolation type semiconductor device 101 according to this second embodiment, the second porous oxide film area 30 (second supplementary layer) is formed in the semiconductor substrate 1 in a manner to contact the lower surface of the buried oxide film layer 3 at the location right under the insulating layer 9. With this arrangement, the following effects can be obtained in addition to the above-mentioned effects of the first embodiment. That is, stress generated upon formation of the insulating layer 9 (trench isolation) is alleviated by the second porous oxide film area 30. Accordingly, the occurrence of defects around the insulating layer 9 can be suppressed, and at the same time, a change in the turn-on characteristic of a power device due to a piezo effect can be prevented, thus making it possible to improve the operational reliability of the power device.

In this regard, note that in the processes or steps of FIGS. 8A and 8B in the manufacturing method according to the above-mentioned first embodiment, a p⁺ diffusion area 22 is provided in an area of a p-type silicon substrate 20 for formation of a first porous oxide film area 10 and a second porous oxide film area 30, and an anodization current 23 is passed from a rear surface of the p-type silicon substrate 20 to the p⁺ diffusion area 22, whereby the first porous oxide film area 10 and the second porous oxide film area 30 are formed on the p-type silicon substrate 20. Thereafter, by performing the processes or steps of FIGS. 8C through 8E, a dielectric isolation type semiconductor device 101 can be fabricated, Embodiment 3.

Figure 10:
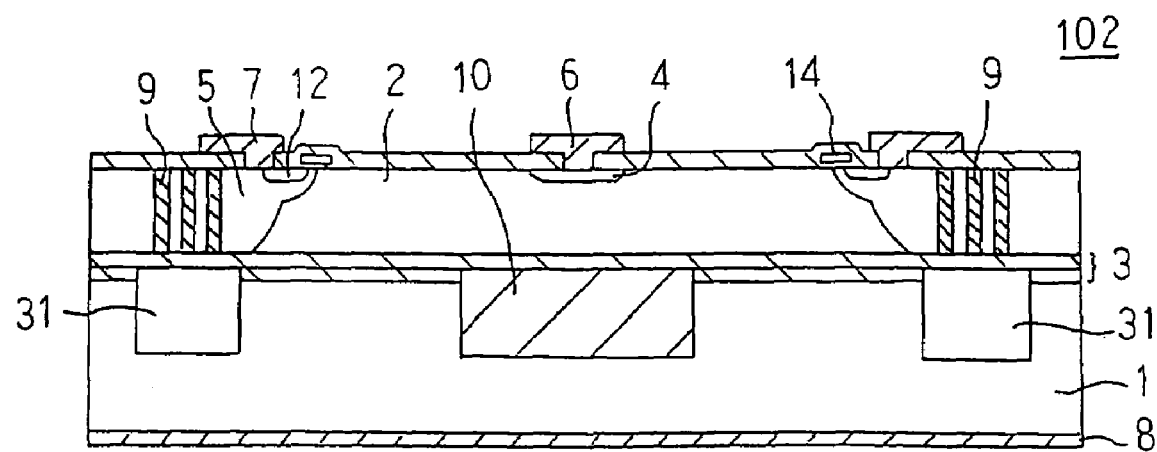
FIG. 10 is a cross sectional view showing a dielectric isolation type semiconductor device according to a third embodiment of the present invention.

FIG. 10 is a cross sectional view that illustrates a dielectric isolation type semiconductor device according to a third embodiment of the present invention. FIG. 11A through 11E are cross sectional views that explain a method of manufacturing a dielectric isolation type semiconductor device according to the third embodiment of the present invention.

In FIG. 10, a first hollow or cavity area (buried cavity) 31 is formed in a semiconductor substrate 1 at a location right under an insulating layer 9 so as to be in contact with a lower surface of a buried oxide film layer 3.

Here, note that the construction of this third embodiment other than the above is similar to that of the above-mentioned first embodiment.

Next, reference will be made to a method of manufacturing a dielectric isolation type semiconductor device 102 as constructed in this manner while referring to FIGS. 11A through 11E.

Figure 11A:
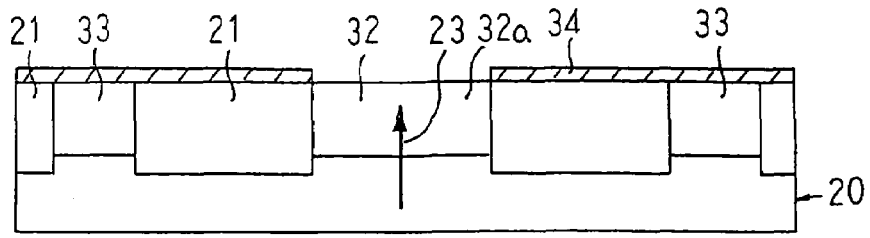
FIGS. 11A through 11E are cross sectional views explaining a method of manufacturing a dielectric isolation type semiconductor device according to the third embodiment of the present invention.

First of all, a p-type silicon substrate 20 is prepared as a semiconductor substrate, and then, an n⁺ diffusion area 21, a first p⁺ diffusion area 32 and a second p⁺ diffusion area 33 are formed on a principal plane of the p-type silicon substrate 20. At this time, the n⁺ diffusion area 21 is formed so as to surround the p⁺ diffusion area 32, and the second p⁺ diffusion area 33 is formed in the shape of a ring so as to be positioned at a location right under the insulating layer 9. Subsequently, as shown in FIG. 11A, an oxide film 34 is formed on the principal plane of the p-type silicon substrate 20, and patterned so as to expose the first p⁺ diffusion area 32. Then, an anodization current 23 is passed from the rear surface of the p-type silicon substrate 20 to the first p⁺ diffusion area 32, whereby the first p⁺ diffusion area 32 is formed into a porous silicon area 32a.

Figure 11B:
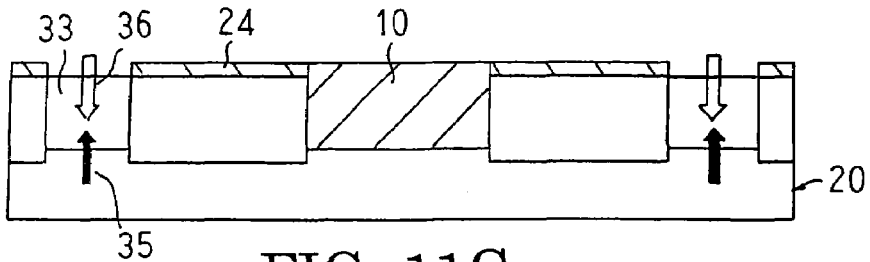
Figure 11C:
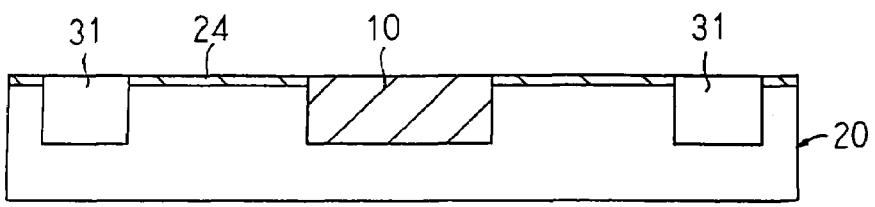

Subsequently, after the oxide film 34 is removed, the p-type silicon substrate 20 is subjected to oxidation processing similar to that in the above-mentioned first embodiment. As a result, the porous silicon area 32a is oxidized to form a first porous oxide film area 10, and an oxide film area 24 is formed in an area at the principal plane side of the p-type silicon substrate 20 excluding the first porous oxide film area 10. Thereafter, the oxide film area 24 is patterned in a manner to expose the second p⁺ diffusion area 33, and then, as shown in FIG. 11B, an anodization current 35 of a relatively high voltage is supplied so that the second p⁺ diffusion area 33 is subjected to electrolytic polishing 36. Consequently, as shown in FIG. 11C, the second p⁺ diffusion area 33 is removed to form a first cavity area 31 on the p-type silicon substrate 20.

Figure 11D:
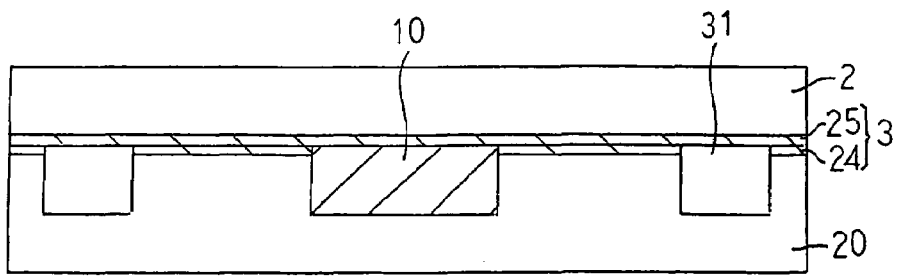

Subsequently, an n-type silicon substrate is prepared which has an oxide film layer 25 formed on its principal plane. Then, the first porous oxide film area 10 and the oxide film layer 25 are placed in intimate contact with each other, and the p-type silicon substrate 20 and the n-type silicon substrate are bonded to each other and subjected to a thermal treatment such as pyro-oxidation or the like, for example, at a temperature of 1,200° C. for 3 hours, so that the strength of bonding therebetween can be improved. Thereafter, the n-type silicon substrate is polished or ground to a predetermined thickness, thereby forming the n⁻ type semiconductor layer 2. As a result, an SOI (Silicon On Insulator) structure as shown in FIG. 11D is obtained. Here, note that the oxide film area 24 and the oxide film layer 25 correspond to the buried oxide film layer 3.

Figure 11E:
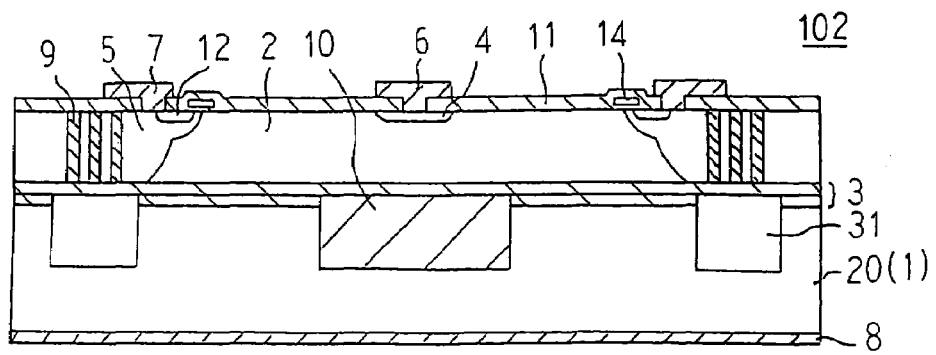

Then, a dielectric isolation type semiconductor device 102 having an n-channel HV-MOS formed thereon, as shown in FIG. 11E, is fabricated by means of an SOI process, as in the above-mentioned first embodiment.

In the dielectric isolation type semiconductor device 102 according to this third embodiment, the first cavity area 31 is formed in the semiconductor substrate 1 in such a manner as to contact the lower surface of the buried oxide film layer 3 at the location right under the insulating layer 9. With this arrangement, the following effects can be obtained in addition to the above-mentioned effects of the first embodiment.

That is, stress generated upon formation of the insulating layer 9 (trench isolation) is alleviated by the first cavity area 31. Accordingly, the occurrence of defects around the insulating layer 9 can be suppressed, and at the same time, a change in the turn-on characteristic of the power device due to a piezo effect can be prevented, thus making it possible to improve the operational reliability of the power device.

As a result, increasing of the dielectric resistance of the power device as well as reduction of the stress involved therein can be achieved at the same time.

Embodiment 4.

Figure 12A:
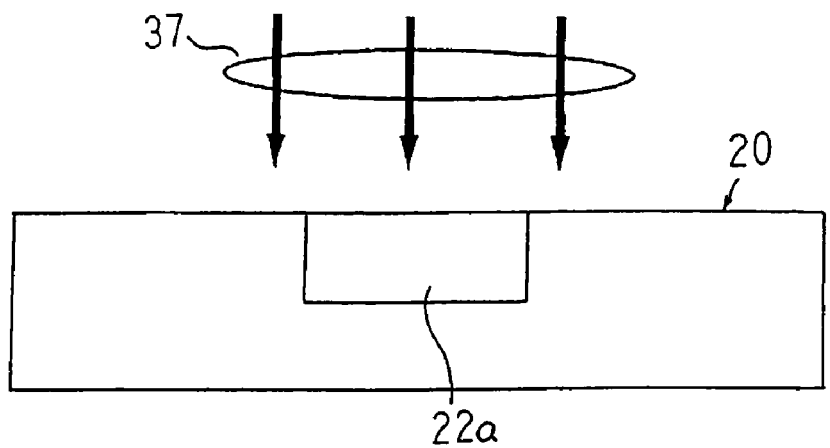
FIGS. 12A through 12C are cross sectional views explaining a step of forming a porous oxide film area in a method of manufacturing a dielectric isolation type semiconductor device according to a fourth embodiment of the present invention.
Figure 12B:
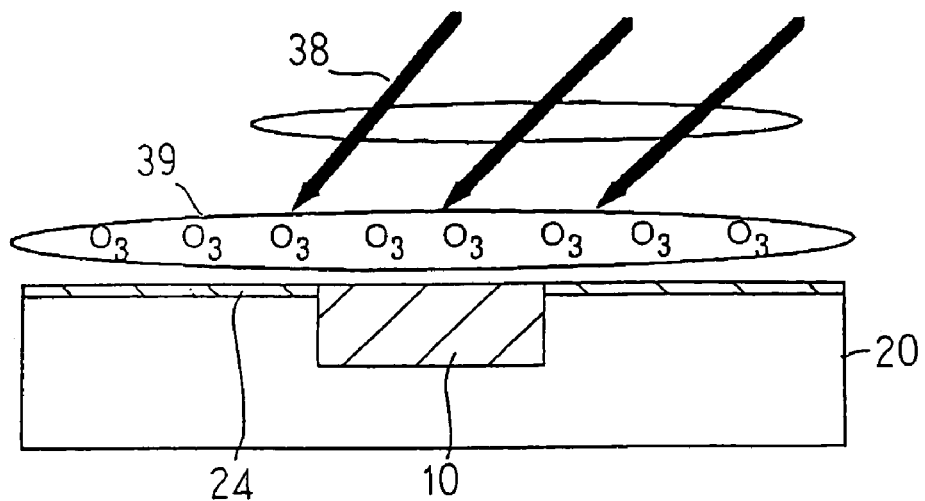
Figure 12C:
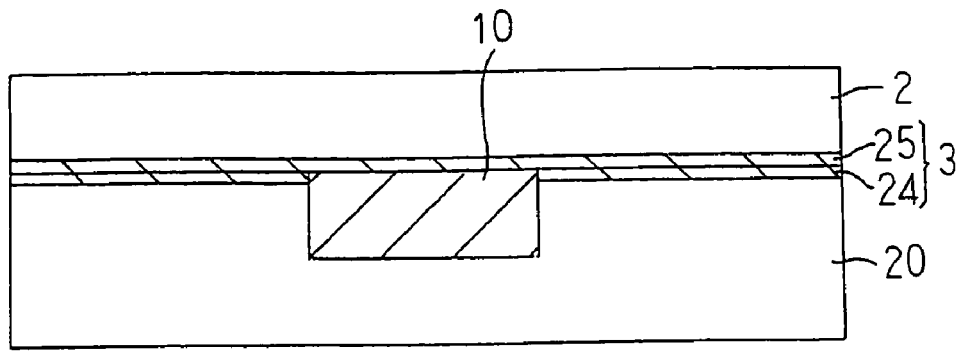

FIGS. 12A through 12C are cross sectional views that explain a method of manufacturing a dielectric isolation type semiconductor device according to a fourth embodiment of the present invention.

Next, reference will be made to the method of manufacturing a dielectric isolation type semiconductor device while referring to FIGS. 12A through 12C.

First of all, the processes or steps shown in FIGS. 8A and 8B in the above-mentioned first embodiment are executed so that a porous silicon area 22a is formed on the principal plane of a p-type silicon substrate 20.

Then, the p-type silicon substrate 20 is subjected to vacuum heating 37 in a temperature range of 300° C. or below, as shown in FIG. 12A, so that the interior of the porous silicon area 22a is dried and degassed.

Subsequently, the p-type silicon substrate 20 is placed in an oxygen atmosphere at a pressure of 10 atm, and irradiated by an electron beam 38, as shown in FIG. 12B. As a result, ozone 39 is generated in the vicinity of the principal plane of the p-type silicon substrate 20, and the porous silicon area 22a and the principal plane side of the p-type silicon substrate 20 are oxidized so that an oxide film area 24 and a first porous oxide film area 10 are formed on the principal plane side of the p-type silicon substrate 20.

Subsequently, an n-type silicon substrate is prepared which has an oxide film layer 25 formed on its principal plane. Then, the first porous oxide film area 10 and the oxide film layer 25 are placed in intimate contact with each other, and the p-type silicon substrate 20 and the n-type silicon substrate are bonded to each other and subjected to a thermal treatment such as pyro-oxidation or the like, for example, at a temperature of 1,200° C. for 3 hours, so that the strength of bonding therebetween can be improved. Thereafter, the n-type silicon substrate is polished or ground to a predetermined thickness, thereby forming an n$^-$ type semiconductor layer 2. As a result, an SOI structure as shown in FIG. 12C is obtained. Here, note that the oxide film area 24 and the oxide film layer 25 correspond to the buried oxide film layer 3.

Then, a dielectric isolation type semiconductor device having an n-channel HV-MOS formed thereon is fabricated by means of an SOI process, as in the above-mentioned first embodiment.

According to this fourth embodiment, an oxidation step performed prior to a step of bonding the p-type silicon substrate 20 and the n-type silicon substrate to each other is performed under a low temperature environment, so the generation of foreign matters in the oxidation step can be reduced, and at the same time, the generation of new stress in a boundary area between the oxide film area 24 and the first porous oxide film area 10 can be reduced. Accordingly, irregularities (convexes and concaves) on the oxidized surface of the principal plane of the p-type silicon substrate 20 are suppressed, whereby the generation of unbonded areas can also be suppressed upon bonding together of the p-type silicon substrate 20 and the n-type silicon substrate, and the strength of bonding therebetween can be improved. As a result, the fraction defective in the manufacture of an SOI substrate can be reduced, thus making it possible to obtain a more highly reliable device.

Embodiment 5.

Figure 13:
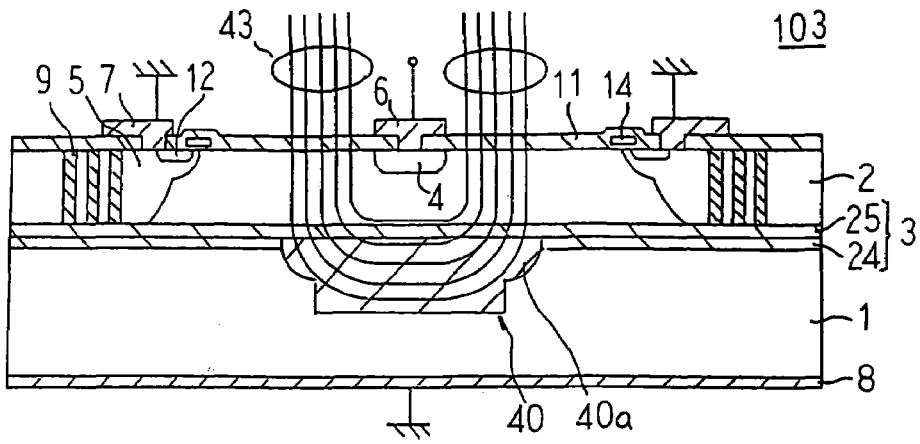
FIG. 13 is a cross sectional view explaining a dielectric resistance voltage application state in a dielectric isolation type semiconductor device according to a fifth embodiment of the present invention.
Figure 14:
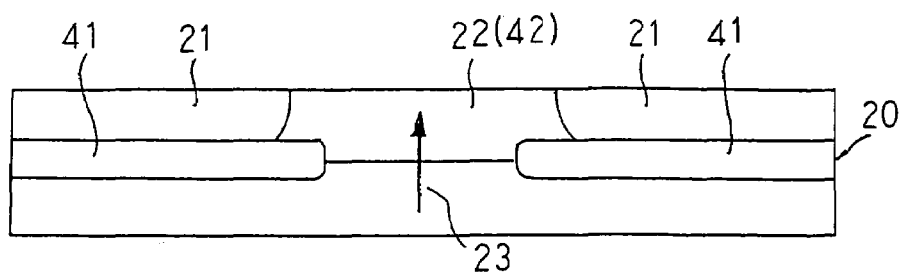
FIG. 14 is a cross sectional view explaining a porous silicon area forming step in a method of manufacturing a dielectric isolation type semiconductor device according to the fifth embodiment of the present invention.

FIG. 13 is a cross sectional view that explains a dielectric resistance voltage application state in a dielectric isolation type semiconductor device according to a fifth embodiment of the present invention. FIG. 14 is a cross sectional view that explains a method of manufacturing a dielectric isolation type semiconductor device according to the fifth embodiment of the present invention.

In FIG. 13, a first ring-shaped porous oxide film area 40 (first supplementary dielectric layer) is formed in a semiconductor substrate 1 in such a manner as to contact a lower surface of a buried oxide film layer 3 at a location right under a first main electrode 6. The first porous oxide film area 40 is formed, on its outer peripheral portion in contact with the buried oxide film layer 3, with a pair of protruded portions 40a that protrude in a diametral or radial direction thereof.

Here, note that the construction of this fifth embodiment other than the above is similar to that of the above-mentioned first embodiment.

Next, reference will be made to a method of manufacturing a dielectric isolation type semiconductor device 103 as constructed in this manner.

First of all, as shown in FIG. 14, n$^+$ diffusion areas 21 and a p$^+$ diffusion area 22 are selectively formed on a principal plane of a p-type silicon substrate 20, respectively, and n$^+$ buried diffusion areas 41 are further formed in ranges extending right under the n$^+$ diffusion areas 21 and the peripheral portions of the p$^+$ diffusion area 22 at a depth adjoining the n$^+$ diffusion areas 21. Thereafter, an anodization current 23 is supplied to flow in a direction indicated by an arrow thereby to form the p$^+$ diffusion area 22 into a porous silicon area 42. Since the current path of this anodization current 23 is limited to a p substrate area and the p$^+$ diffusion area, the porous silicon area 42 thus formed becomes an inverted convex shape.

Subsequently, the p-type silicon substrate 20 is oxidized to form an oxide film area 24 and a first porous oxide film area 40, which is in the shape of an inverted convex having protruded portions 40a formed on the outer peripheral portions thereof. After that, an n-type silicon substrate and the p-type silicon substrate 20 are bonded together, and the n-type silicon substrate is grounded or polished to provide an n$^-$ type semiconductor layer 2, on which a power device is formed, whereby a dielectric isolation type semiconductor device 103 is obtained.

Figure 15:
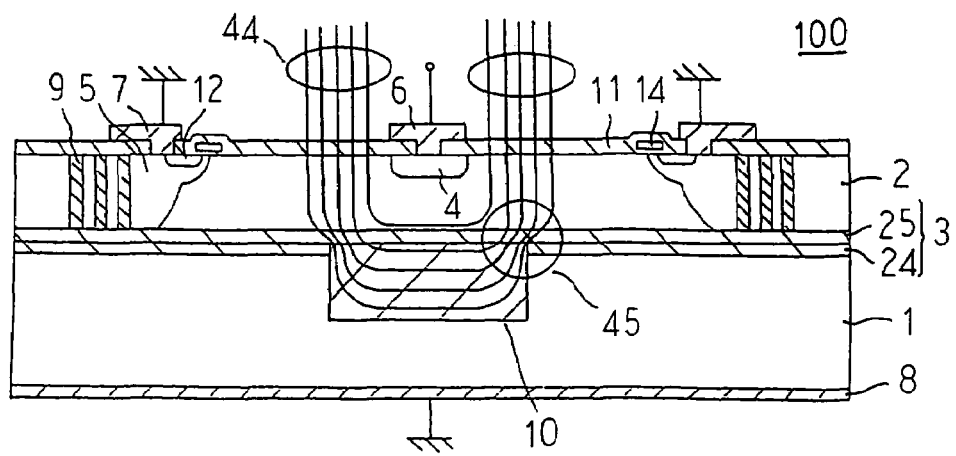
FIG. 15 is a cross sectional view explaining a dielectric resistance voltage application state in the dielectric isolation type semiconductor device according to the first embodiment of the present invention.

Here, in the dielectric isolation type semiconductor device 100 according to the above-mentioned first embodiment, when a high voltage of plus (+) polarity is applied to the first main electrode 6 with the second main electrode 7 and the rear surface electrode 8 being grounded to the earth potential, a voltage potential 44 is formed over the n$^-$ type semiconductor layer 2, the oxide film layer 25, the oxide film area 24 and the first porous oxide film area 10, as shown in FIG. 15. In such a voltage potential 44, a concentration of electric field 45 might take place at an end portion of the first porous oxide film area 10, and become a factor that brings about unstable operation or dielectric breakdown due to excessive electric field concentration.

On the other hand, in this dielectric isolation type semiconductor device 103 according to the fifth embodiment, when a high voltage of plus polarity is applied to the first main electrode 6 with the second main electrode 7 and the rear surface electrode 8 being grounded to the earth potential, a voltage potential 43 is formed over the n⁻ type semiconductor layer 2, the oxide film layer 25, the oxide film area 24 and the first porous oxide film area 40, as shown in FIG. 13. In this case, the voltage potential 43 thus formed extends along the protrusion profiles of the protruded portions 40a of the first porous oxide film area 40, so that the above-mentioned electric field concentration 45 at an end portion of the first porous oxide film area 10 can be alleviated. Accordingly, instability in operation or generation of dielectric breakdown resulting from such an electric field concentration 45 can be suppressed, thus making it possible to avoid the degradation of device properties.

Embodiment 6.

Figure 16:
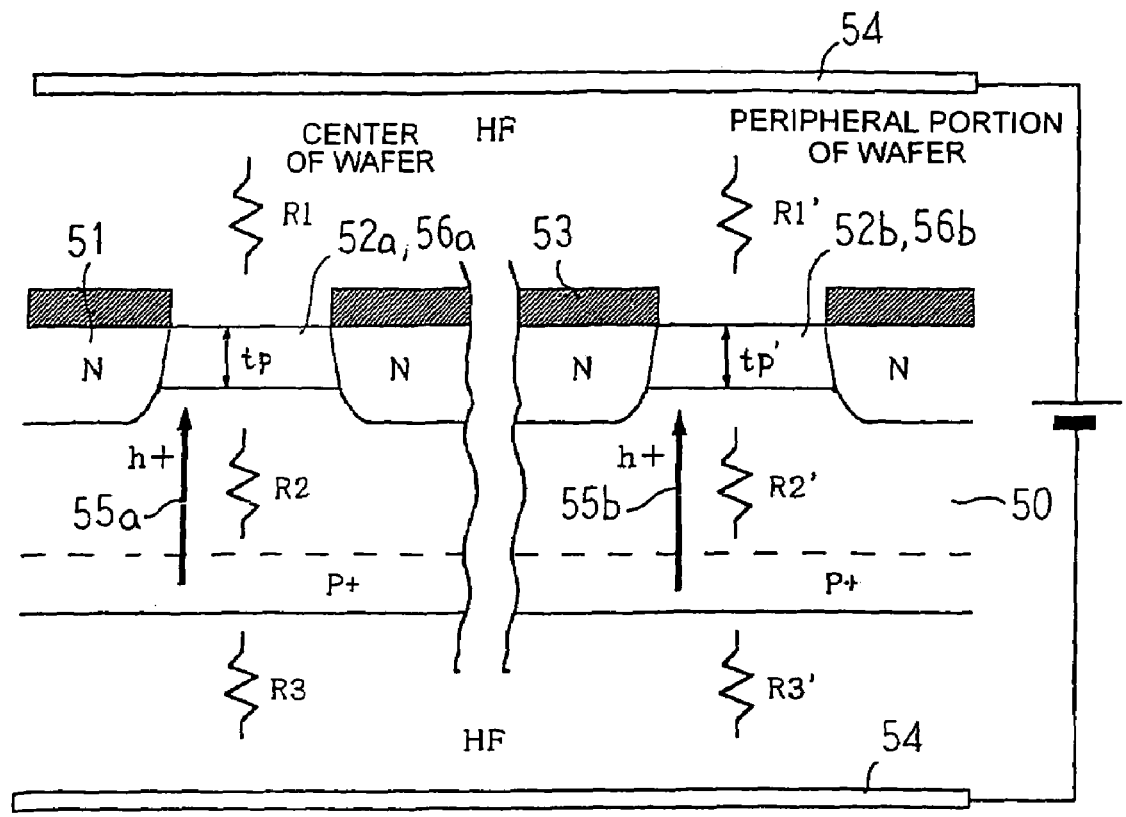
FIG. 16 is a schematic diagram explaining an anodization process, applied to a method of manufacturing a dielectric isolation type semiconductor device according to the present invention.
Figure 17:
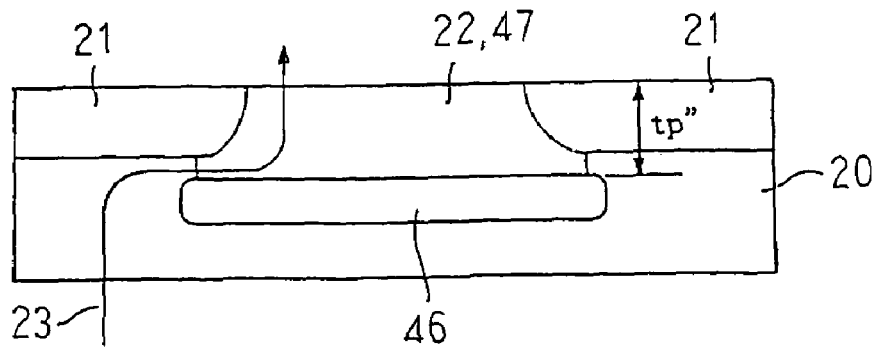
FIG. 17 is a cross sectional view explaining a porous silicon area forming step in a method of manufacturing a dielectric isolation type semiconductor device according to a sixth embodiment of the present invention.

FIG. 16 is a schematic diagram that explains an anodization process applied to a method of manufacturing a dielectric isolation type semiconductor device according to the present invention. FIG. 17 is a cross sectional view that explains a porous silicon area forming process or step in a method of manufacturing a dielectric isolation type semiconductor device according to a sixth embodiment of the present invention.

First, anodization will be described below while referring to FIG. 16. For the sake of convenience, reference character "a" is attached to a member located in the central portion of a wafer, and reference character "b" is attached to a member located on the peripheral portions of the wafer.

First, n⁺ diffusion areas 51 and p⁺ diffusion areas 52a, 52b are selectively formed on a principal plane of a p-type silicon wafer 50, respectively, and oxide film areas 53 are formed on the principal plane of the p-type silicon wafer 50 in such a manner as to expose the p⁺ diffusion areas 52a, 52b. The p-type silicon wafer 50 constructed in this manner is soaked in an HF solution, and a voltage is applied between a pair of Pt electrodes 54 to perform anodization. At this time, anodization currents 55a, 55b flow from the rear surface of the p-type silicon wafer 50 to the p⁺ diffusion areas 52a, 52b, respectively, whereby the p⁺ diffusion areas 52a, 52b are formed into porous silicon areas 56a, 56b, respectively.

Here, let us assume that the resistance components (i.e., three portions of the wafer 50) of the current path of the anodization current 55a are R1, R2 and R3; the depth of the porous silicon area 56a thus formed is tp; the resistance components (i.e., three portions of the wafer 50) of the current path of the anodization current 55b are R1', R2' and R3'; and the depth of the porous silicon area 56b thus formed is tp'.

If an imbalance or disproportion takes place between the total resistances (R1+R2+R3) and (R1'+R2'+R3') of the respective current paths at each position, there will also occur an imbalance or disproportion between the depths tp, tp' of the porous silicon areas 56a, 56b, which is in inverse proportion to the magnitude of the imbalance or disproportion between the total resistances. As a result, variations in the depths of the porous silicon areas in the p-type silicon wafer 50 will be increased. This will bring about variation in the actual dielectric strength values of power devices formed on the p-type silicon wafer 50 after fabrication thereof.

Specifically, in this sixth embodiment, as shown in FIG. 17, n⁺ diffusion areas 21 and a p⁺ diffusion area 22 are selectively formed on a principal plane of a p-type silicon substrate 20, respectively, and an n⁺ buried diffusion area 46 is further formed in a range extending right under the p⁺ diffusion area 22 and the peripheral portions of the n⁺ diffusion areas 21 at a depth apart from the n⁺ diffusion areas 21. Thereafter, an anodization current 23 is supplied to form the p⁺ diffusion area 22 into a porous silicon area 47.

In this case, the anodization current 23 flows through a current path extending from the rear surface of the p-type silicon substrate 20 to the p⁺ diffusion area 22 while bypassing the n⁺ buried diffusion area 46, and the porous silicon in the p⁺ diffusion area 22 grows in a way to proceed upstream through the current path of the anodization current 23. At a stage where the n⁺ buried diffusion area 46 is reached, the growth of the porous silicon in the direction of depth is stopped, and the porous silicon area 47 of a depth tp" is obtained.

Thereafter, for example, in accordance with the steps shown in FIGS. 8C through 8E, the p-type silicon substrate 20 is oxidized, and the n-type silicon substrate and the p-type silicon substrate 20 are then bonded together, after which the n-type silicon substrate is grounded or polished to provide an n⁻ type semiconductor layer 2, on which a power device is finally formed, whereby a dielectric isolation type semiconductor device is obtained.

Thus, since in the method of forming a porous silicon area according to this sixth embodiment, the n⁺ buried diffusion area 46 is formed in a range extending right under the p⁺ diffusion area 22 and the peripheral portions of the n⁺ diffusion areas 21 at a depth apart from the n⁺ diffusion areas 21, the growth of the porous silicon due to anodization is stopped at the stage where the n⁺ buried diffusion area 46 is reached. In this manner, the depth of the porous silicon area 47 can be controlled by the position in the direction of depth of the n⁺ buried diffusion area 46, so even if there is a variation in the total resistances of the current paths, it is possible to form the porous silicon area 47 of a uniform depth on the entire surface of the wafer 50.

Therefore, by using the method of forming a porous silicon area according to this embodiment, power devices having desired characteristics can be manufactured with high yield in a stable manner.

Embodiment 7.

Figure 18A:
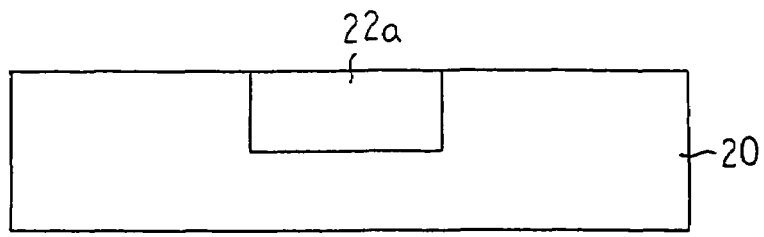
FIGS. 18A through 18C are cross sectional views explaining an oxidation step and a bonding step in the method of manufacturing a dielectric isolation type semiconductor device according to the first embodiment of the present invention.
Figure 18B:
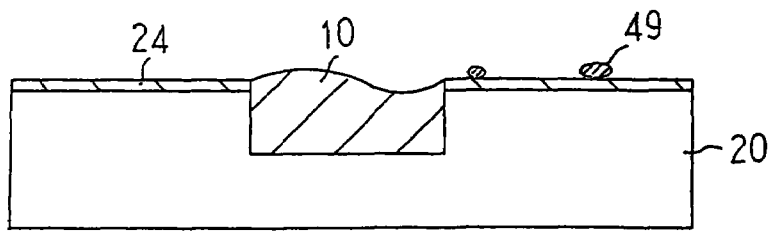
Figure 18C:
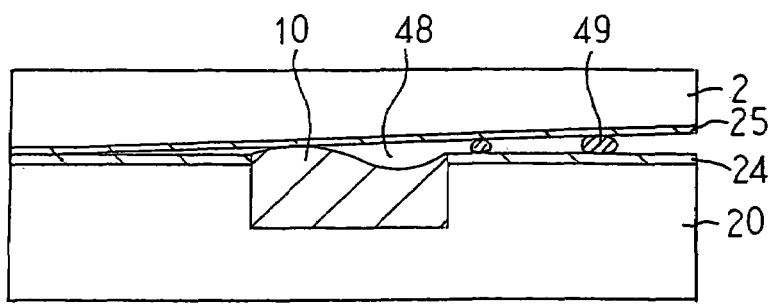
Figure 19:
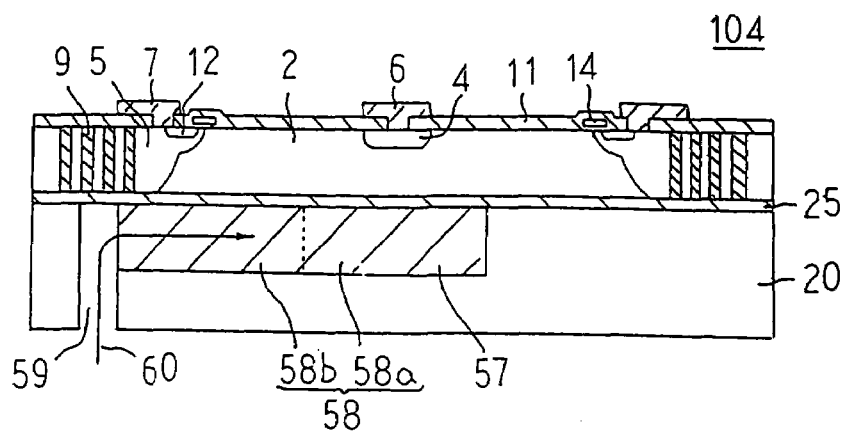
FIG. 19 is a cross sectional view explaining a porous oxide film area forming step in a method of manufacturing a dielectric isolation type semiconductor device according to a seventh embodiment of the present invention.

FIGS. 18A through 18C are cross sectional views that explain an oxidation step and a bonding step in the method of manufacturing a dielectric isolation type semiconductor device according to the first embodiment of the present invention. FIG. 19 is a cross sectional view that explains a porous oxide film area forming step in a method of manufacturing a dielectric isolation type semiconductor device according to a seventh embodiment of the present invention.

First, reference will be made to the case where a porous oxide film area is formed into a p-type silicon substrate prior to a step of bonding the p-type silicon substrate and an n-type silicon substrate to each other while referring to FIGS. 18A through 18C.

An n⁺ diffusion area and a p⁺ diffusion area are formed on a principal plane of a p-type silicon substrate 20, and the p-type silicon substrate 20 is then anodized in an HF solution. As a result, there is obtained the p-type silicon substrate 20 with a porous silicon area 22a formed therein, as shown in FIG. 18A.

Then, after the porous silicon area 22a is once exposed to an oxidizing atmosphere at a low temperature of 300° C. or below, it is oxidized at a high temperature of 1,100° C. or above to form an oxide film area 24 and a first porous oxide film area 10.

In this oxidation step, if the porosity of the porous silicon area 22a is non-uniform, there will take place an imbalance or disproportion between the growth rate of an oxide film and a stress distribution in the porous silicon area 22*a*, as a consequence of which irregularities (convexes and concaves) might be generated in the surface of the first porous oxide film area 10, as shown in FIG. 18B.

In case where irregularities are generated on the surface of the first porous oxide film area 10, there might be induced bonding defects (unbonded areas) 48 between the p-type silicon substrate 20 and the n-type silicon substrate (i.e., the n⁻ type semiconductor layer 2), as shown in FIG. 18C.

In this case, a series of operations such as diffusion processes, oxidations and the like are required during the time from the formation of porous silicon areas until the completion of oxidations, thus resulting in a fear that foreign matters 49 might be attached or included. The attachment or inclusion of the foreign matters 49 leads to the generation of the bonding defects (unbonded areas) 48 between the p-type silicon substrate 20 and the n-type silicon substrate.

In a dielectric isolation type semiconductor device 104 according to this seventh embodiment, as shown in FIG. 19, a first porous oxide film area 58 includes a disk-shaped main portion 58*a* (first supplementary dielectric layer) being formed in the p-type silicon substrate 20 so as to be in contact with a lower surface of an oxide film layer 25, and extending 40% or more of a distance L between first and second main electrodes 6, 7 from the first main electrode 6 side toward the second main electrode 7 while including a location right under the first main electrode 6, and an extended portion 58*b* (third supplementary dielectric layer) of a predetermined width extending from the main portion 58*a* up to a location right under the second main electrode 7. Additionally, a rear surface opening portion 59 is formed through the p-type silicon substrate 20 at the location right under the insulating layer 9 so as to extend from a rear surface of the p-type silicon substrate 20 up to the oxide film layer 25. The extended portion 58*b* of the first porous oxide film area 58 is exposed to the rear surface opening portion 59.

Here, note that the construction of this seventh embodiment other than the above is similar to that of the above-mentioned first embodiment.

Next, reference will be made to a method of manufacturing the dielectric isolation type semiconductor device 104 as constructed in this manner while referring to FIGS. 18A through 18C and 19.

First of all, a p-type silicon substrate 20 formed with a porous silicon area 57 of the same configuration as that of the above-mentioned first porous oxide film area 58 is obtained.

Then, an n-type silicon substrate is prepared which has an oxide film layer 25 formed on its principal plane. Thereafter, the principle plane of the p-type silicon substrate 20 with the porous silicon area 57 formed therein and the principle plane of the n-type silicon substrate with the oxide film layer 25 formed thereon are placed in intimate contact with each other, and the p-type silicon substrate 20 and the n-type silicon substrate are bonded to each other and subjected to a thermal treatment such as pyro-oxidation or the like, for example, at a temperature of 1,200° C. for 3 hours, so that the strength of bonding therebetween can be improved. Thereafter, the n-type silicon substrate is polished or ground to a predetermined thickness, thereby forming an n⁻ type semiconductor layer 2. Further, an n-channel HV-MOS is formed on the n⁻ type semiconductor layer 2 by means of an SOI process. After that, a rear surface opening portion 59 is formed through the p-type silicon substrate 20 in a manner as to extend from the rear surface of the p-type silicon substrate 20 up to the oxide film layer 25 located right under the insulating layer 9 by means of dry etching, KOH etching, etc. Here, a part of the porous silicon area 57 is exposed to the rear surface opening portion 59.

Subsequently, in such a state, the porous silicon area 57 is exposed to a high ozone concentration atmosphere, whereby the oxidation, by ozone 60, of the porous silicon area 57 proceeds from the rear surface opening portion 59 to a first main electrode 6 side, thus forming a first porous oxide film area 58.

In this seventh embodiment, an end portion of the main portion 58*a* of the first porous oxide film area 58 is positioned at a location apart 40% or more of a distance L between first and second main electrodes 6, 7 from the first main electrode 6 side toward the second main electrode 7. Therefore, similar to the above-mentioned first embodiment, a voltage drop is increased by the first porous oxide film area 58, thus improving dielectric strength.

Moreover, according to this seventh embodiment, the p-type silicon substrate 20 with the porous silicon area 57 formed thereon and the n-type silicon substrate are bonded together, and the n-type silicon substrate is polished or ground to form the n⁻ type semiconductor layer 2. After the n-channel HV-MOS is formed on the n⁻ type semiconductor layer 2, the rear surface opening portion 59 is formed through the p-type silicon substrate 2 so that the porous silicon area 57 is oxidized by the ozone 60 from the rear surface opening portion 59. In other words, after the p-type silicon substrate 20 and the n-type silicon substrate are bonded together, the step of oxidizing the porous silicon area 57 is executed, and hence there will not take place the aforementioned problem of bonding defects (unbonded areas) 48 between the p-type silicon substrate 20 and the n-type silicon substrate, which would otherwise result from irregularities of the surface of the first porous oxide film area. Similarly, the attachment or inclusion of foreign matters 49 resulting from a series of operations such as diffusion processes, oxidations or the like does not occur during the time from the formation of porous silicon areas until the completion of oxidations, so the generation of the bonding defects (unbonded areas) 48 between the p-type silicon substrate 20 and the n-type silicon substrate due to the foreign matters 49 can be suppressed.

Accordingly, it is possible to obtain a dielectric isolation type semiconductor device and a method of manufacture therefor in which the reduction of bonding defects and the achievement of high dielectric resistance can be made mutually compatible.

Although the first porous oxide film area 58 formed by the method of this embodiment holds more or less stress, the bonding strength of an interface between the oxide film and the silicon substrate bonded together beforehand is far stronger as compared with that stress, and hence such stress does not come to induce bonding defects. In addition, since the rear surface opening portion 59 is not in a state to extend through the oxide film layer 25 and the diameter of the front surface opening portion 63 is smaller than 100 μm, there is no fear of causing impediments to wafer suction in an assembly step.

Moreover, although the porous silicon area 57 is oxidized in the high concentration ozone atmosphere, it may be oxidized in an oxygen atmosphere.

Embodiment 8.

In an eighth embodiment of the present invention, the porosity of the porous silicon area 57 in the seventh above-mentioned embodiment is adjusted to be 0.6 or more.

In this eighth embodiment, since the porosity of the porous silicon area 57 is set to be 0.6 or more, it is possible to ensure an oxidation rate of a prescribed value or above as well as to suppress stress in the porous silicon area 57 after oxidization thereof. As a result, it is possible not only to reduce bonding defects but also to improve operational reliability in a power device of a dielectric isolation type semiconductor device fabricated according to this embodiment.

Embodiment 9.

Figure 20:
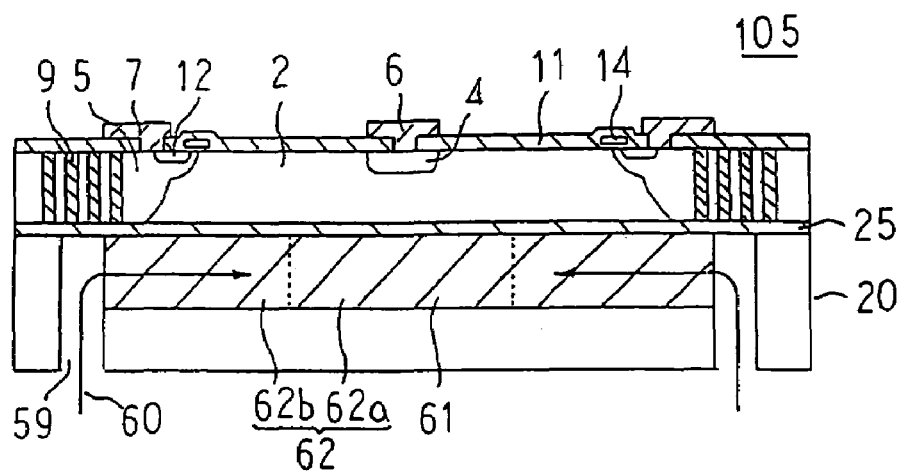
FIG. 20 is a cross sectional view explaining a porous oxide film area forming step in a method of manufacturing a dielectric isolation type semiconductor device according to a ninth embodiment of the present invention.
Figure 21:
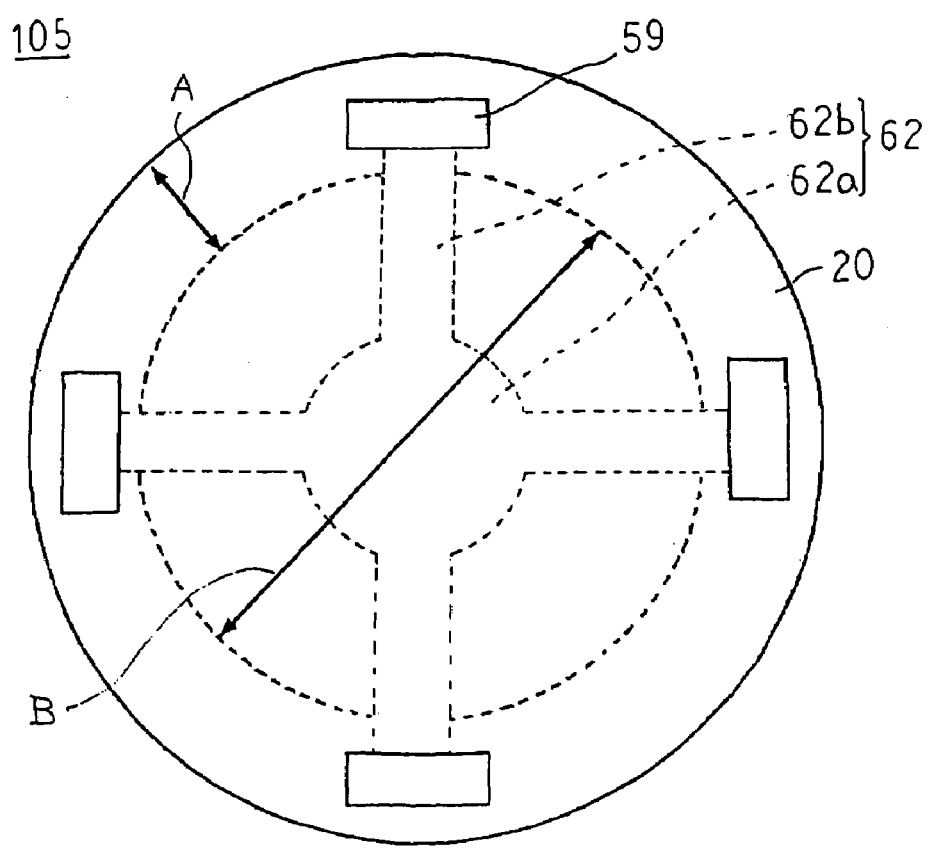
FIG. 21 is a rear view explaining the porous oxide film area forming step in the method of manufacturing a dielectric isolation type semiconductor device according to a ninth embodiment of the present invention.

FIGS. 20 and 21 are a cross sectional view and a rear view, respectively, that explain a porous oxide film area forming process or step in a method of manufacturing a dielectric isolation type semiconductor device according to a ninth embodiment of the present invention.

In FIGS. 20 and 21, a first porous oxide film area 62 includes a disk-shaped main portion 62a (first supplementary dielectric layer) being formed in a p-type silicon substrate 20 so as to be in contact with a lower surface of an oxide film layer 25, and extending 40% or more of a distance L between first and second main electrodes 6, 7 from the first main electrode 6 side toward the second main electrode 7 while including a location right under the first main electrode 6, and a plurality of (e.g., four in the illustrated example) extended portions 62b (third supplementary dielectric layer) each of a predetermined width extending from the main portion 62a up to the location right under the second main electrode 7. In addition, the four extended portions 62b are formed so as to extend from the main portion 62a at an equiangular pitch or interval in a circumferential direction. Also, a corresponding number (e.g., four in the illustrated example) of rear surface opening portions 59 are formed through the p-type silicon substrate 20 at locations right under the insulating layer 9 so as to extend from a rear surface of the p-type silicon substrate 20 up to the oxide film layer 25. The extended portions 62b of the first porous oxide film area 62 are exposed to the corresponding rear surface opening portions 59, respectively. In FIG. 21, reference character A denotes an isolation area defined by the insulating layer 9, and reference character B denotes a power device area.

Here, note that the construction of this ninth embodiment other than the above is similar to that of the above-mentioned seventh embodiment.

Next, reference will be made to a method of manufacturing a dielectric isolation type semiconductor device 105 as constructed in the above manner while referring to FIGS. 20 and 21.

First of all, a p-type silicon substrate 20 formed with a porous silicon area 61 is obtained. The porous silicon area 61 is in the same shape as that of the above-mentioned first porous oxide film area 62.

Then, an n-type silicon substrate is prepared which has an oxide film layer 25 formed on its principal plane. Thereafter, the principle plane of the p-type silicon substrate 20 with the porous silicon area 61 formed therein and the principle plane of the n-type silicon substrate with the oxide film layer 25 formed thereon are placed in intimate contact with each other, and the p-type silicon substrate 20 and the n-type silicon substrate are bonded to each other and subjected to a thermal treatment such as pyro-oxidation or the like, for example, at a temperature of 1,200° C. for 3 hours, so that the strength of bonding therebetween can be improved. Subsequently, the n-type silicon substrate is polished or ground to a predetermined thickness, thereby forming an n⁻ type semiconductor layer 2. Further, an n-channel HV-MOS is formed on the n⁻ type semiconductor layer 2 by means of an SOI process. After that, rear surface opening portions 59 are formed through the p-type silicon substrate 20 in a manner as to extend from the rear surface of the p-type silicon substrate 20 up to the oxide film layer 25 located right under the insulating layer 9 by means of dry etching, KOH etching, etc. Here, parts of the porous silicon area 61 are exposed to the rear surface opening portions 59.

Subsequently, in such a state, the porous silicon area 61 is exposed to a high ozone concentration atmosphere, whereby the oxidation, by ozone 60, of the porous silicon area 61 proceeds from the rear surface opening portions 59 to a first main electrode 6 side, thus forming the first porous oxide film area 62, as shown in FIG. 20.

Accordingly, in this ninth embodiment, too, the step of oxidizing the porous silicon area 61 is executed after the p-type silicon substrate 20 and the n-type silicon substrate are bonded together, so it is possible to make compatible the reduction of bonding defects and the achievement of high dielectric resistance, as in the above-mentioned seventh embodiment.

In addition, according to this ninth embodiment, the four extended portions 62b are formed at an equiangular pitch or interval in a circumferential direction, so that the oxidation of the porous silicon area 61 proceeds in upward, downward, rightward and leftward directions in FIG. 21. As a result, there is little likelihood that the stress distribution and the configuration of the oxide film obtained might locally lose balance at one side of the device.

Although in the ninth embodiment, four extended portions 61b are formed at an equiangular pitch or interval in a circumferential direction, the number of the extended portions 61b is not limited to four but may be any if not less than two, and they have only to be formed at an equiangular pitch or interval in a circumferential direction so as ensure their structural symmetry.

Embodiment 10.

Figure 22A:
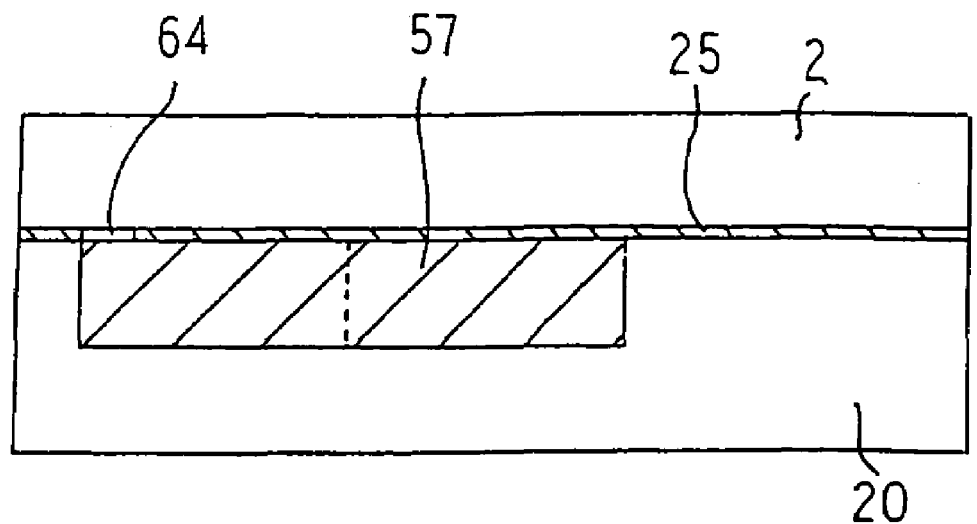
FIGS. 22A and 22B are cross sectional views explaining a porous oxide film area forming step in a method of manufacturing a dielectric isolation type semiconductor device according to a tenth embodiment of the present invention.
Figure 22B:
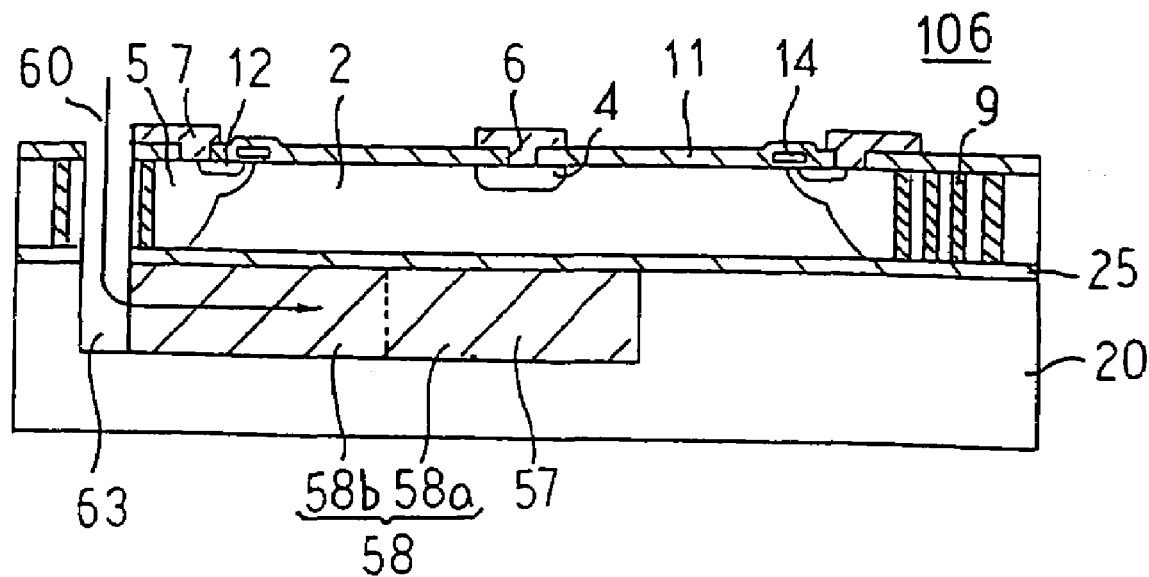

FIGS. 22A and 22B are cross sectional views that explain a porous oxide film area forming step in a method of manufacturing a dielectric isolation type semiconductor device according to a tenth embodiment of the present invention.

A dielectric isolation type semiconductor device 106 according to this tenth embodiment is of the same construction as that of the above-mentioned seventh embodiment excluding that a front surface opening portion 63 is provided in place of the rear surface opening portion 59.

Next, reference will be made to the method of manufacturing a dielectric isolation type semiconductor device according to this tenth embodiment while referring to FIGS. 22A and 22B.

First of all, a p-type silicon substrate 20 having a porous silicon area 57 formed therein is obtained, as in the above-mentioned seventh embodiment.

Then, an n-type silicon substrate is prepared which has an oxide film layer 25 formed on its principal plane, and a part of the oxide film layer 25 is removed to form an oxide film removal area 64. Here, note that this oxide film removal area 64 is formed so as to be positioned at a location right under an insulating layer 9 which will be described later.

Thereafter, the principle plane of the p-type silicon substrate 20 with the porous silicon area 57 formed therein and the principle plane of the n-type silicon substrate with the oxide film layer 25 formed thereon are placed in intimate contact with each other, and the p-type silicon substrate 20 and the n-type silicon substrate are bonded to each other and subjected to a thermal treatment such as pyro-oxidation or the like, for example, at a temperature of 1,200° C. for 3 hours, so that the strength of bonding therebetween can be improved. Subsequently, the n-type silicon substrate is polished or ground to a predetermined thickness, thereby forming an n⁻ type semiconductor layer 2, as shown in FIG. 22A.

Then, an n-channel HV-MOS is formed on the n⁻ type semiconductor layer 2 by means of an SOI process. Thereafter, as shown in FIG. 22B, a front surface opening portion 63 is formed through the n⁻ type semiconductor layer 2 in a manner as to extend from a front surface of the n⁻ type semiconductor layer 2 up to a bottom surface of the porous silicon area 57 at a location of the formation of the oxide film removal area 64 by means of dry etching, KOH etching, etc. Here, a part of the porous silicon area 57 is exposed to the front surface opening portion 63.

Subsequently, in such a state, the porous silicon area 57 is exposed to a high ozone concentration atmosphere, whereby the oxidation, by ozone 60, of the porous silicon area 57 proceeds from the front surface opening portion 63 to a first main electrode 6 side, thus forming a first porous oxide film area 58.

In this tenth embodiment, too, an end portion of the main portion 58a of the first porous oxide film area 58 is positioned at a location apart 40% or more of a distance L between the first and second main electrodes 6, 7 from the first main electrode 6 side toward the second main electrode 7, so a voltage drop can be increased by the first porous oxide film area 58, thus improving dielectric strength.

Thus, in this tenth embodiment, too, the step of oxidizing the porous silicon area 57 is executed after the p-type silicon substrate 20 and the n-type silicon substrate are bonded together, and hence it is possible to make compatible the reduction of bonding defects and the achievement of high dielectric resistance, as in the above-mentioned seventh embodiment.

Although the first porous oxide film area 58 formed by the method of this embodiment holds more or less stress, the bonding strength of an interface between the oxide film and the silicon substrate bonded together beforehand is far stronger as compared with that stress, and hence such stress does not come to induce bonding defects. In addition, since the front surface opening portion 63 is not in a state to extend through the p-type silicon substrate 20 to its rear surface and the diameter of the front surface opening portion 63 is smaller than 100 μm, there is no fear of causing impediments to wafer suction in an assembly step.

In this tenth embodiment, too, if the porosity of the porous silicon area 57 is set to be 0.6 or more, an oxidation rate not less than a prescribed value can be ensured, thus making it possible to suppress stress in the porous silicon area 57 after oxidization thereof. As a result, it is possible not only to reduce bonding defects but also to improve operational reliability in a power device of a dielectric isolation type semiconductor device fabricated according to this embodiment.

Embodiment 11.

Figure 23:
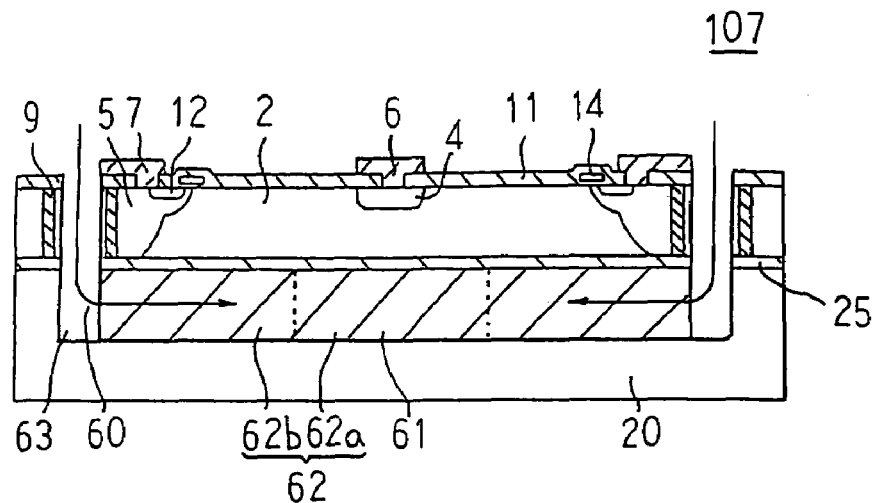
FIG. 23 is a cross sectional view explaining a porous oxide film area forming step in a method of manufacturing a dielectric isolation type semiconductor device according to an eleventh embodiment of the present invention.
Figure 24:
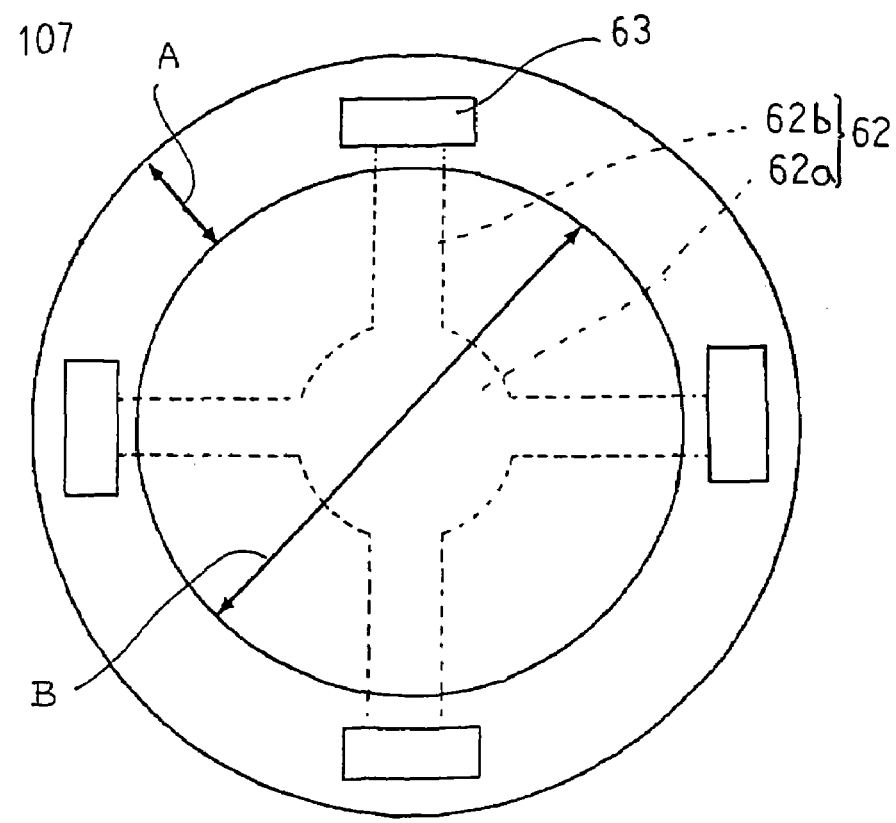
FIG. 24 is a top plan view explaining the porous oxide film area forming step in the method of manufacturing a dielectric isolation type semiconductor device according to the eleventh embodiment of the present invention.

FIGS. 23 and 24 are a cross sectional view and a top plan view, respectively, that explain a porous oxide film area forming step in a method of manufacturing a dielectric isolation type semiconductor device according to an eleventh embodiment of the present invention.

A dielectric isolation type semiconductor device 107 according to this eleventh embodiment is of the same construction as that of the above-mentioned ninth embodiment excluding that a plurality of front surface opening portions 63 are provided in place of the rear surface opening portion 59.

Next, reference will be made to the method of manufacturing a dielectric isolation type semiconductor device according to this eleventh embodiment while referring to FIGS. 23 and 24.

First of all, a p-type silicon substrate 20 having a porous silicon area 61 formed therein is obtained, as in the above-mentioned ninth embodiment.

Then, an n-type silicon substrate is prepared which has an oxide film layer 25 formed on its principal plane, and parts of the oxide film layer 25 are removed to form a plurality of oxide film removal areas 64, as in the above-mentioned tenth embodiment. Here, note that these oxide film removal areas 64 are formed so as to be positioned at a location right under an insulating layer 9 which will be described later.

Thereafter, the principle plane of the p-type silicon substrate 20 with the porous silicon area 61 formed therein and the principle plane of the n-type silicon substrate with the oxide film layer 25 formed thereon are placed in intimate contact with each other, and the p-type silicon substrate 20 and the n-type silicon substrate are bonded to each other and subjected to a thermal treatment such as pyro-oxidation or the like, for example, at a temperature of 1,200° C. for 3 hours, so that the strength of bonding therebetween can be improved. Subsequently, the n-type silicon substrate is polished or ground to a predetermined thickness, thereby forming an n⁻ type semiconductor layer 2.

Then, an n-channel HV-MOS is formed on the n⁻ type semiconductor layer 2 by means of an SOI process. Thereafter, as shown in FIG. 23, a plurality of (e.g., four in the illustrated example) front surface opening portions 63 are formed through the n⁻ type semiconductor layer 2 in a manner as to extend from a front surface of the n⁻ type semiconductor layer 2 up to a bottom surface of the porous silicon area 61 at locations of the formation of the oxide film removal areas 64 by means of dry etching, KOH etching, etc. Here, parts of the porous silicon area 61 are exposed to the front surface opening portions 63.

Subsequently, in such a state, the porous silicon area 61 is exposed to a high ozone concentration atmosphere, whereby the oxidation, by ozone 60, of the porous silicon area 61 proceeds from the front surface opening portions 63 to a first main electrode 6 side, thus forming a first porous oxide film area 62.

Accordingly, in this eleventh embodiment, too, the step of oxidizing the porous silicon area 61 is executed after the p-type silicon substrate 20 and the n-type silicon substrate are bonded together, so it is possible to make comparable the reduction of bonding defects and the achievement of high dielectric resistance, as in the above-mentioned seventh embodiment.

In addition, according to this eleventh embodiment, the four extended portions 62b are formed at an equiangular pitch or interval in a circumferential direction, so that, the oxidation of the porous silicon area 61 proceeds in upward, downward, rightward and leftward directions in FIG. 24. As a result, there is little likelihood that the stress distribution and the configuration of the oxide film obtained might locally lose balance at one side of the device.

Although in the eleventh embodiment, four extended portions 62b are formed at an equiangular pitch or interval in a circumferential direction, the number of the extended portions 62b is not limited to four but may be any if not less than two, and they have only to be formed at an equiangular pitch or interval in a circumferential direction so as ensure their structural symmetry.

Embodiment 12.

Figure 25A:
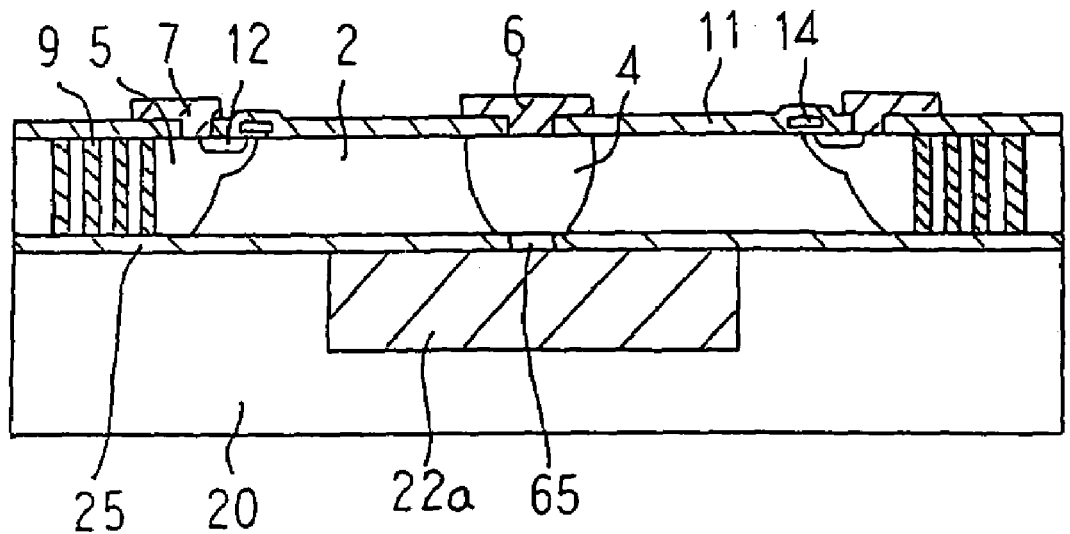
FIGS. 25A and 25B are cross sectional views showing a method of manufacturing a dielectric isolation type semiconductor device according to a twelfth embodiment of the present invention.
Figure 25B:
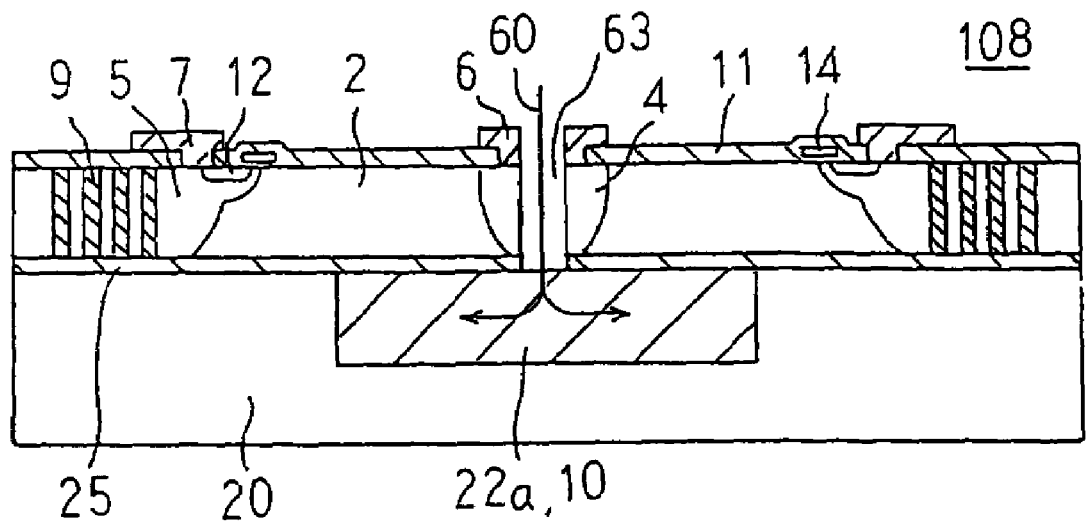

FIGS. 25A and 25B are cross sectional views that illustrate a method of manufacturing a dielectric isolation type semiconductor device according to a twelfth embodiment of the present invention.

Next, reference will be made to the method of manufacturing a dielectric isolation type semiconductor device 108 according to this twelfth embodiment while referring to FIGS. 25A and 25B.

First of all, a p-type silicon substrate 20 having a porous silicon area 22a formed therein is obtained, as in the above-mentioned first embodiment.

Then, an n-type silicon substrate is prepared which has an oxide film layer 25 formed on its principal plane, and a part of the oxide film layer 25 is removed to form an oxide film removal area 65. Here, note that this oxide film removal area 65 is formed so as to be positioned at a location right under a first main electrode 6.

Thereafter, the principle plane of the p-type silicon substrate 20 with the porous silicon area 22a formed therein and the principle plane of the n-type silicon substrate with the oxide film layer 25 formed thereon are placed in intimate contact with each other, and the p-type silicon substrate 20 and the n-type silicon substrate are bonded to each other and subjected to a thermal treatment such as pyro-oxidation or the like, for example, at a temperature of 1,200° C. for 3 hours, so that the strength of bonding therebetween can be improved. Subsequently, the n-type silicon substrate is polished or ground to a predetermined thickness, thereby forming an n⁻ type semiconductor layer 2.

Then, an n-channel HV-MOS is formed on the n⁻ type semiconductor layer 2 by means of an SOI process, as shown in FIG. 25A. At this time, the depth of diffusion of an n⁺ type semiconductor area 4 (n⁺ diffusion area) reaches the oxide film layer 25 so that it comes in contact with a buried hollow or cavity portion, which is defined by the oxide film removal area 65, at a location right under the oxide film layer 25.

Thereafter, as shown in FIG. 25B, a front surface opening portion 63 is formed through the n⁻ type semiconductor layer 2 in a manner as to extend from a front surface of the n⁻ type semiconductor layer 2 up to the porous silicon area 22a at a location of the formation of the oxide film removal area 64 by means of dry etching, KOH etching, etc. In such a state, the porous silicon area 22a is exposed to a high ozone concentration atmosphere so that it is oxidized by ozone 60 contained therein to provide a first porous oxide film area 10.

Accordingly, in this twelfth embodiment, too, the step of oxidizing the porous silicon area 22a is executed after the p-type silicon substrate 20 and the n-type silicon substrate are bonded together, so there will not take place the aforementioned problem of bonding defects (unbonded areas) 48 between the p-type silicon substrate 20 and the n-type silicon substrate, which would otherwise result from irregularities of the surface of the first porous oxide film area. Similarly, the attachment or inclusion of foreign matters resulting from a series of operations such as diffusion processes, oxidations and the like does not take place during the time from the formation of porous silicon areas until the completion of oxidations, whereby the generation of bonding defects (unbonded areas) between the p-type silicon substrate 20 and the n-type silicon substrate due to foreign matters can be suppressed.

Accordingly, it is possible to obtain a dielectric isolation type semiconductor device and a method of manufacture therefor in which the reduction of bonding defects and the achievement of high dielectric resistance can be made mutually compatible.

Although the first porous oxide film area 10 formed by the method of this embodiment holds more or less stress, the bonding strength of an interface between the oxide film and the silicon substrate bonded together beforehand is far stronger as compared with that stress, and hence such stress does not come to induce bonding defects. In addition, since the front surface opening portion 63 is not in a state to extend through the p-type silicon substrate 20 to its rear surface and the diameter of the front surface opening portion 63 is smaller than 100 μm, there is no fear of causing impediments to wafer suction in an assembly step.

Although in the above-mentioned respective embodiments, a power device in the form of an n-channel MOS is formed on the n⁻ type semiconductor layer 2, such a power device to be formed on the n⁻ type semiconductor layer 2 is not limited to an n-channel MOS transistor, but may be other devices such as, for example, an npn transistor, an n-channel MCT (MOS Controlled Thyristor), an n-channel EST (Emitter Switched Thyristor), IGBT (Insulated Gate Bipolar Transistor), etc.

While the invention has been described in terms of preferred embodiments, those skilled in the art will recognize that the invention can be practiced with modifications within the spirit and scope of the appended claims.

What is claimed is:

1. A method for manufacturing a dielectric isolation type semiconductor device in which a semiconductor substrate and an active layer are bonded to each other through a main dielectric layer, and a supplementary dielectric layer comprising a porous oxide film is formed in said semiconductor substrate in a state contacting with said main dielectric layer, with a power device being formed on said active layer, said method comprising:

a step of forming a p⁺ diffusion area and an n⁺ diffusion area on a principal plane of said semiconductor substrate;

a step of forming an n⁺ buried diffusion area at a location under said p⁺ diffusion area in such a manner that said buried n⁺ diffusion area is in contact with said p⁺ diffusion area and overlaps with a lower portion of an outer periphery of said n⁺ diffusion area in a manner apart therefrom;

a step of making said p⁺ diffusion area porous to a depth up to said n⁺ buried diffusion area;

a step of oxidizing the principal plane side of said semiconductor substrate and said area that has been made porous;

a step of bonding said semiconductor substrate and an active layer side silicon substrate to each other;

a step of polishing said active layer side silicon substrate to form said active layer; and a step of forming said power device on said active layer.

2. The method for manufacturing a dielectric isolation type semiconductor device as set forth in claim 1, wherein said oxidizing step performs low-temperature oxidation at 300° C. or lower, and subsequently performs high-temperature oxidation at 1,100° C. or higher.

3. The method for manufacturing a dielectric isolation type semiconductor device as set forth in claim 1, wherein said oxidizing step performs vacuum heating at 300° C. or below, and subsequently performs electron beam irradiation in an oxygen atmosphere at 10 atm or above.

4. A method for manufacturing a dielectric isolation type semiconductor device in which a semiconductor substrate and an active layer are bonded to each other through a main dielectric layer, and a supplementary dielectric layer comprising a porous oxide film is formed in said semiconductor substrate in a state contacting with said main dielectric layer, with a power device being formed in an isolation area on said active layer, said method comprising:

a step of forming a $p^+$ diffusion area and an $n^+$ diffusion area on a principal plane of said semiconductor substrate;

a step of making said $p^+$ diffusion area porous to form a porous area;

a step of removing a part of that portion of an oxide film layer formed on a rear surface of an active layer side silicon substrate which corresponds to a location right under said isolation area;

a step of bonding said semiconductor substrate and an active layer side silicon substrate to each other;

a step of polishing said active layer side silicon substrate to form said active layer;

a step of forming said isolation area on said active layer;

a step of forming said power device in said isolation area on said active layer;

a step of forming, at a location of said isolation area, an opening portion extending from a front surface of said active layer to said porous area through a removal area in which the part of said oxide film layer is removed; and a step of exposing said porous area to a high ozone concentration atmosphere or a thermal oxidation atmosphere through said opening portion to oxidize said porous area thereby to form said supplementary dielectric layer.

5. The method for manufacturing a dielectric isolation type semiconductor device as set forth in claim 4, wherein said porous area has a porosity of 0.6 or more.

6. The method for manufacturing a dielectric isolation type semiconductor device as set forth in claim 4, wherein said opening portion is arranged in plurality at an equiangular pitch in a circumferential direction with respect to a center of said power device.

* * * * *